US012646543B2

(12) United States Patent
Kong et al.

(10) Patent No.: US 12,646,543 B2
(45) Date of Patent: Jun. 2, 2026

(54) MEMORY DEVICE HAVING TRACKING WORD LINE WITH ADJUST CIRCUIT, METHOD OF OPERATING SAME AND METHOD OF MANUFACTURING SAME

(71) Applicants: TAIWAN SEMICONDUCTOR MANUFACTURING COMPANY, LTD, Hsinchu (TW); TSMC NANJING COMPANY, LIMITED, Nanjing (CN)

(72) Inventors: Luping Kong, Hsinchu (TW); Chia-Cheng Chen, Hisnchu (TW); Ching-Wei Wu, Hsinchu (TW); Jun Xie, Hsinchu (TW)

(73) Assignees: TAIWAN SEMICONDUCTOR MANUFACTURING COMPANY, LTD., Hsinchu (TW); TSMC NANJING COMPANY, LIMITED, Nanjing (CN)

( * ) Notice: Subject to any disclaimer, the term of this patent is extended or adjusted under 35 U.S.C. 154(b) by 178 days.

(21) Appl. No.: 18/472,132

(22) Filed: Sep. 21, 2023

(65) Prior Publication Data

US 2025/0095704 A1     Mar. 20, 2025

(30) Foreign Application Priority Data

Sep. 15, 2023     (CN) .......................... 202311196716.9

(51) Int. Cl.
| | |
|---|---|
| *G11C 8/08* | (2006.01) |
| *G11C 7/02* | (2006.01) |
| *G11C 7/14* | (2006.01) |

(52) U.S. Cl.
CPC .................. *G11C 8/08* (2013.01); *G11C 7/02* (2013.01); *G11C 7/14* (2013.01)

(58) Field of Classification Search
CPC .... G11C 8/08; G11C 7/02; G11C 7/14; G11C 7/227; G11C 11/401; G11C 11/4074; G11C 11/4085; G11C 11/413; G11C 7/222; G11C 11/412; H10B 10/12; H10B 10/18
USPC ..................................................... 365/185.23
See application file for complete search history.

(56) References Cited

U.S. PATENT DOCUMENTS

| | | | |
|---|---|---|---|
| 8,630,132 | B2 | 1/2014 | Cheng et al. |
| 8,755,239 | B2 | 6/2014 | Holla et al. |
| 2012/0307551 | A1 | 12/2012 | Funane et al. |
| 2016/0019963 | A1 | 1/2016 | Yan |
| 2021/0407594 | A1 | 12/2021 | Su et al. |

(Continued)

FOREIGN PATENT DOCUMENTS

| | | |
|---|---|---|
| KR | 10-2010-0127276 | 12/2010 |
| KR | 10-2015-0120140 | 10/2015 |

(Continued)

*Primary Examiner* — Huan Hoang
(74) *Attorney, Agent, or Firm* — Hauptman Ham, LLP

(57) ABSTRACT

A memory device includes: a first array of memory cells; a second array of tracking cells, the second array being configured to emulate the first array; a first word line coupled to corresponding ones of the memory cells in a corresponding one of rows of the first array and to the tracking cells; a second word line configured to emulate the first word line; a first adjust circuit coupled to the first word line; a second adjust circuit coupled to the second word line; and an adjust-timing circuit coupled to the second adjust circuit.

20 Claims, 13 Drawing Sheets

(56) References Cited

U.S. PATENT DOCUMENTS

| | | | |
|---|---|---|---|
| 2022/0059168 A1* | 2/2022 | Seo | G11C 16/0483 |
| 2022/0189541 A1 | 6/2022 | Yang et al. | |
| 2022/0277789 A1 | 9/2022 | Pao et al. | |

FOREIGN PATENT DOCUMENTS

| | | |
|---|---|---|
| TW | I345785 | 7/2011 |
| TW | I628662 | 7/2018 |

* cited by examiner

600

602
Generate layout diagram

604
Manufacture semiconductor device based on layout diagram

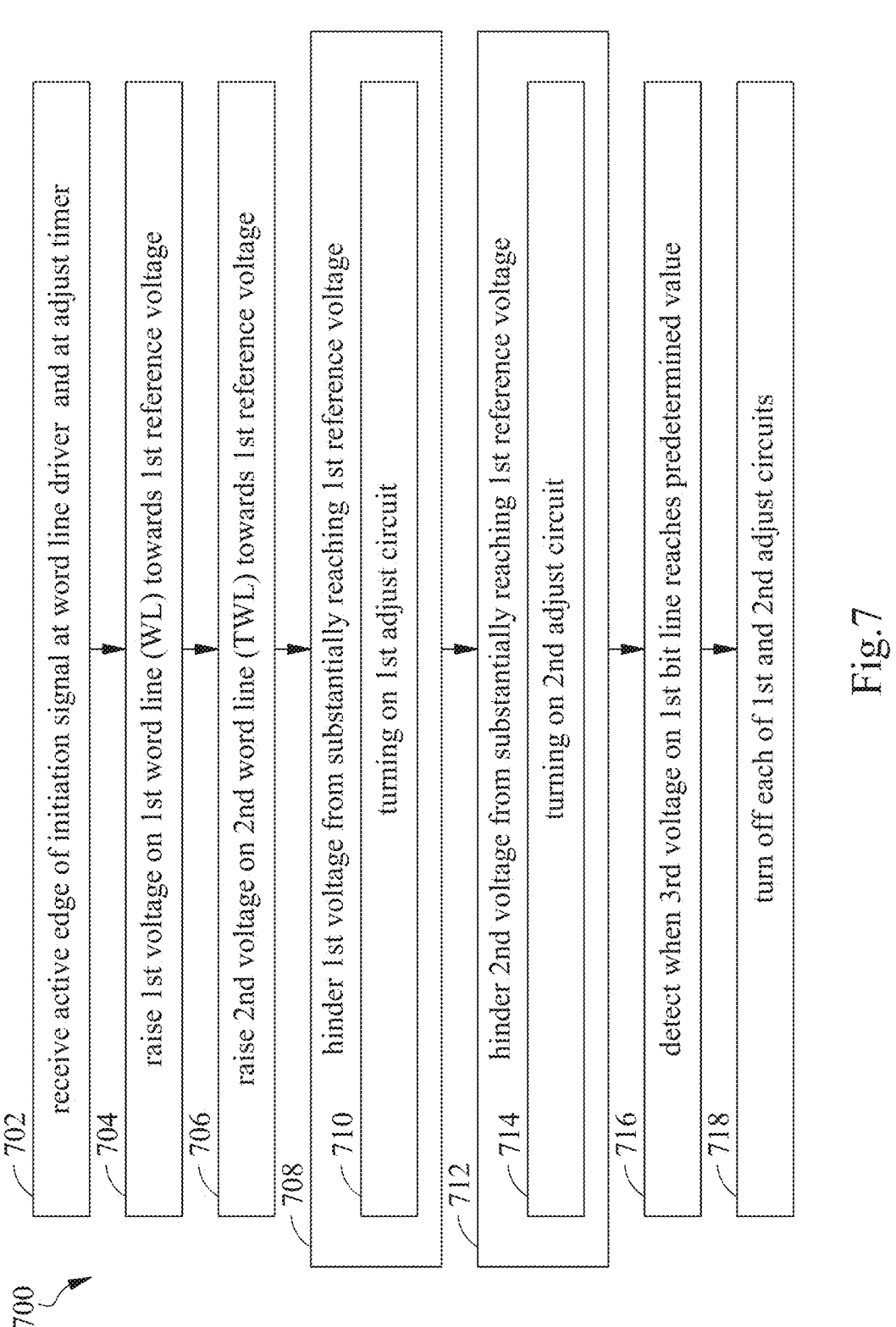

700

702　receive active edge of initiation signal at word line driver and at adjust timer 704　raise 1st voltage on 1st word line (WL) towards 1st reference voltage 706　raise 2nd voltage on 2nd word line (TWL) towards 1st reference voltage 708　hinder 1st voltage from substantially reaching 1st reference voltage 710　turning on 1st adjust circuit 712　hinder 2nd voltage from substantially reaching 1st reference voltage 714　turning on 2nd adjust circuit 716　detect when 3rd voltage on 1st bit line reaches predetermined value 718　turn off each of 1st and 2nd adjust circuits

804
Memory

806
Instructions

807
Library including standard cells

811
Layout Diagram(s)

842
User Interface (UI)

808

810
Input/Output
(I/O)

802
Processor

812
Network
Interface

814
Network

MEMORY DEVICE HAVING TRACKING WORD LINE WITH ADJUST CIRCUIT, METHOD OF OPERATING SAME AND METHOD OF MANUFACTURING SAME

BACKGROUND

A static random access memory (SRAM) is a type of memory device. A one-bit SRAM cell has two storage nodes which store the logical state (low or high) of the bit and of the complement of the bit, namely the bit_bar. A static noise margin (SNM) is a figure of merit applied to an SRAM cell. The SNM of an SRAM cell is the minimum level of noise voltage on each of the two storage nodes that is sufficient to flip the states of the bit and the bit_bar values, i.e., to corrupt the data stored by the SRAM cell. Increases in the SNM make the SRAM cell less susceptible to noise corruption. Decreases in the SNM make the SRAM cell more susceptible to noise corruption.

As semiconductor process technology nodes evolve, the operating voltages of SRAMs progressively decrease. Decreases in operating voltage generally reduce the power consumed by the SRAM cells. Conversely, decreases in operating voltage generally tend to decrease the SNM of the SRAM cell.

Semiconductor devices are not manufactured by ideal devices under ideal conditions but are subjected to the effects of equipment tolerances, materials variations and environmental variations such that the manufactured devices exhibit corresponding variations in resistance, threshold voltage, or the like. The performance space (PS) of a manufactured design represents the range of variation to be expected. As complementary metal oxide semiconductor (CMOS) technology includes both N-channel or negative-channel MOS (NMOS) and P-channel or positive-channel (PMOS) components, the PS for CMOS is typically represented in two-dimensions by a quadrilateral figure having corners that represent extremes in the variation of each of the NMOS and PMOS components, corner=(NMOS, PMOS), e.g., SS=(slow, slow), SF (slow, fast), FF=(fast, fast), or FS (fast, slow). For a given design of a device, local variation occurs within a single wafer (die), whereas global variation occurs across a population of wafers (dies). Examples of global corners are SSG, SFG, FFG and FSG.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIG. 7 is flowchart of a method of operating a memory device, in accordance with some embodiments.

DETAILED DESCRIPTION

Figure 1:
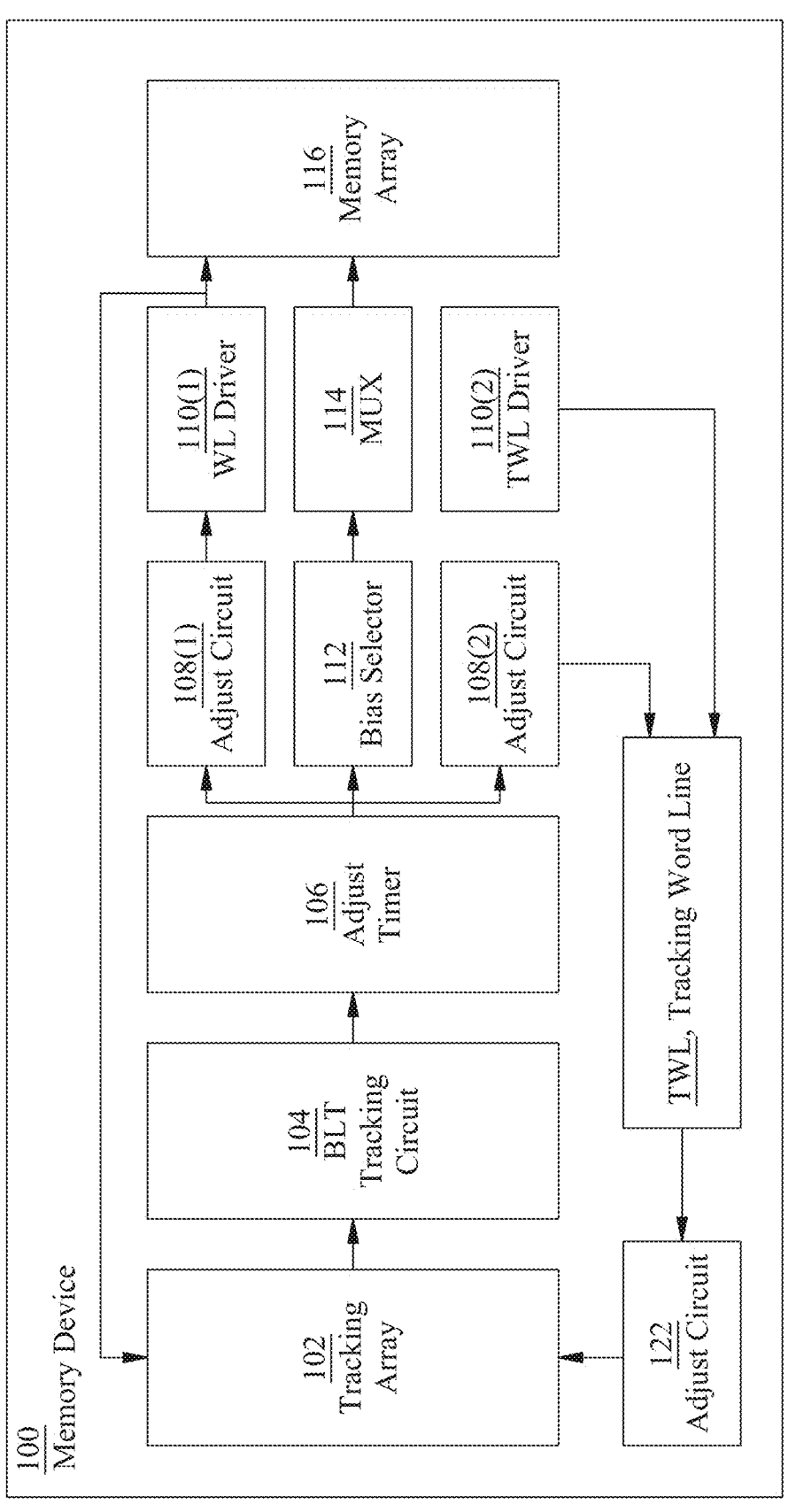
FIG. 1 is a block diagram of a memory device, in accordance with some embodiments.

The following disclosure discloses many different embodiments, or examples, for implementing different features of the subject matter. Examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows include embodiments in which the first and second features are formed in direct contact, and further include embodiments in which additional features are formed between the first and second features, such that the first and second features are in indirect contact. In addition, the present disclosure repeats reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, are used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus is otherwise oriented (rotated 90 degrees or at other orientations) and the spatially relative descriptors used herein are likewise interpreted accordingly. In some embodiments, the term standard cell structure refers to a standardized building block included in a library of various standard cell structures. In some embodiments, various standard cell structures are selected from a library thereof and are used as components in a layout diagram representing a circuit.

In some embodiments, a memory device includes: a first array (e.g., memory array) of memory cells; a second array (e.g., tracking array) of tracking cells, the second array being configured to emulate the first array; a first word line (e.g., word line WL) coupled to corresponding ones of the memory cells in a corresponding one of rows of the memory array and to the tracking cells; a second word line (e.g., tracking word line TWL) configured to emulate word line WL; a first adjust circuit coupled to word line WL; a second adjust circuit coupled to tracking word line TWL; and an adjust-timing circuit coupled to the second adjust circuit. In some embodiments, the memory device further includes a second adjust circuit coupled to word line WL.

An SRAM memory device according to another approach represents a counterpart to embodiments of the SRAM memory devices disclosed herein, e.g., memory device 100. The SRAM memory device according to the other approach provides (1) a word line adjust scheme and tracking word line scheme. The word line adjust scheme according to the other approach includes an adjust circuit coupled to the word line. The tracking word line scheme according to the other approach includes a tracking word line but does not include an adjust circuit coupled to the tracking word line. As part of developing the present embodiments, the present inventors recognized that the emulation of the word line by the tracking word line according to the other approach suffers inaccuracies which reduces the SNM of the SRAM memory device according to the other approach. Based at least in part upon the noted recognition by the present inventors, embodiments of the present application provide a tracking scheme which includes an adjust circuit coupled to the tracking word line. Accordingly, tracking schemes for SRAM memory devices according to embodiments of the present application include an adjust circuit coupled to the tracking word line. Such embodiments of the present application exhibit advantages including greater accuracy of the emulation of the word line by the tracking word line resulting in an increased static noise margin (SNM) of the SRAM memory devices, as compared to the SRAM memory device according to the other approach. In some embodiments, such SRAM memory device embodiments of the present application which include an adjust circuit coupled to the tracking word line exhibit an increase in the read margin in a range of (~10.2)%–(~11.1)% for the SSG process corner (and better for the other global, as compared to the SRAM memory device according to the other approach.

FIG. 1 is a block diagram of a memory device 100, in accordance with some embodiments.

Memory device 100 is, e.g., a semiconductor memory device. In some embodiments, memory device is included in an integrated circuit (IC). In some embodiments, memory device 100 assumes a static random access memory (SRAM) architecture. In some embodiments, memory device 100 has a memory architecture other than an SRAM architecture.

Memory device 100 includes: a tracking array, e.g., a column, 102; a bit line tracking (BLT) circuit 104; an adjust timer 106; an adjust circuit 108(1); an adjust circuit 108(2); a word line (WL) driver 110(1); a tracking word line TWL; a TWL driver 110(2); a bias selector 112; a multiplexer (MUX) 114; a memory array 116 of memory cells (FIG. 2); and an adjust circuit 122. Memory array 116 is coupled to each of WL driver 110(1) and multiplexer 114. WL driver 110(1) is coupled between adjust circuit 108(1) and each of memory array 116 and tracking array 102. Adjust circuit 108(1) is coupled between adjust timer 106 and WL driver 110(1). Multiplexer 114 is coupled between bias selector 112 and memory array 116. Bias selector 112 is coupled between adjust timer 106 and multiplexer 114. Adjust circuit 122 is coupled between tracking word line TWL and tracking array 102. Tracking word line TWL is coupled between (A) each of adjust circuit 108(2) and TWL driver 110(2) and (B) adjust circuit 122. Adjust circuit 108(2) is coupled between tracking word line TWL and adjust timer 106. Adjust timer 106 is coupled between (A) BLT tracking circuit 104 and (B) each of adjust circuit 108(1), bias selector 112 and adjust circuit 108(2). BLT tracking circuit 104 is coupled between tracking array 102 and adjust timer 106. Tracking array 102 is coupled between WL driver 110(1) and BLT tracking circuit 104.

Figure 2:
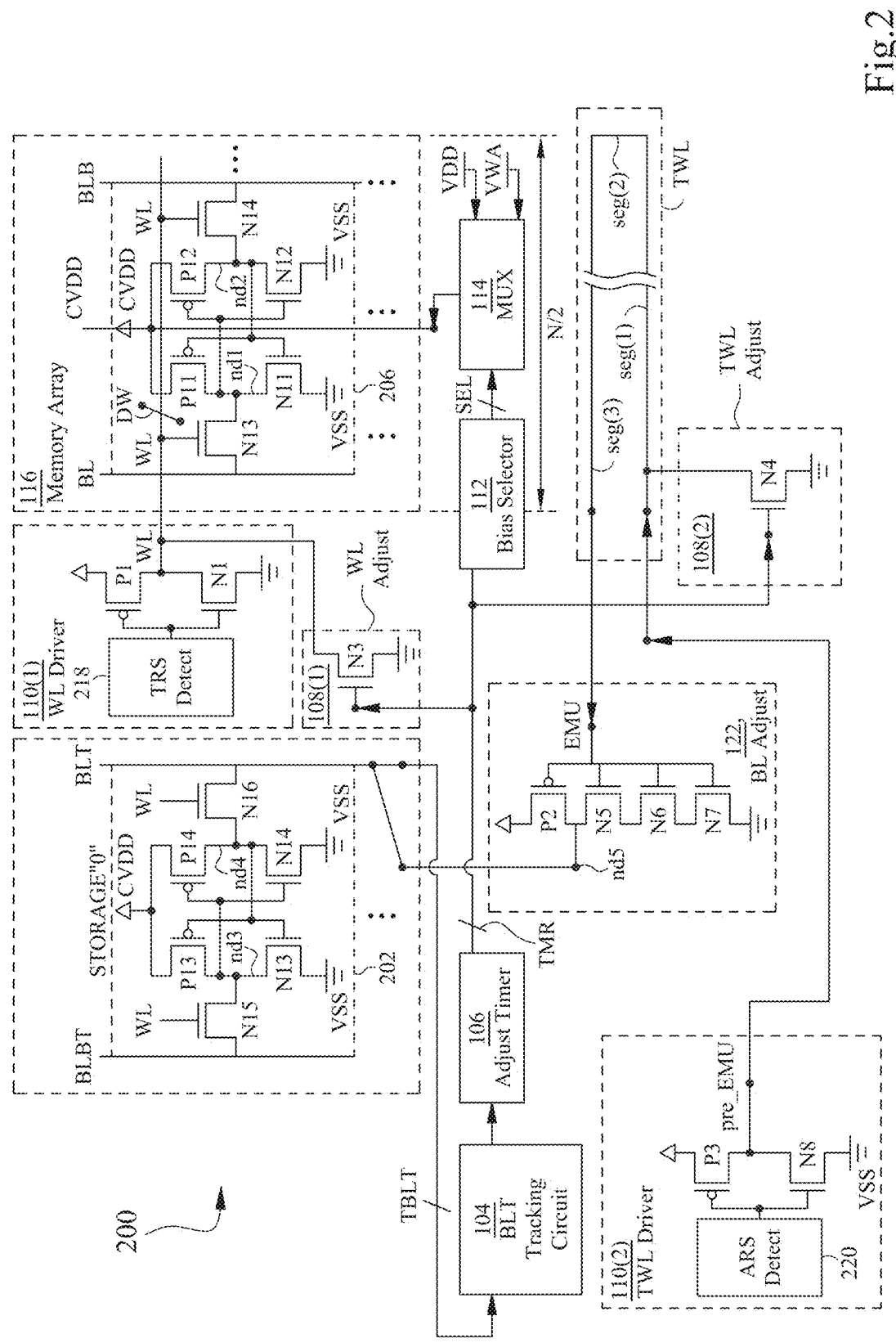
FIG. 2 is a schematic diagram of a memory, in accordance with some embodiments.

In FIG. 1, WL driver 110(1) is configured to drive word line WL (FIG. 2). Tracking word line TWL is configured to emulate word line WL, as discussed below. In some embodiments, TWL driver 110(2) is configured to emulate word line driver WL. In some embodiments, TWL driver 110(2) is configured to exhibit substantially a same operational profile as an operational profile exhibited by word line driver WL. TWL driver 110(2) is configured to output a signal pre_EMU (FIGS. 2-3) to a first end of tracking word line TWL which emerges from a second end of tracking word line TWL as an emulation signal EMU (FIGS. 2-3), and which is received at an input of BL adjust circuit 122 (FIG. 2). BL adjust circuit 122 (FIG. 2) uses emulation signal EMU (FIGS. 2-3) to adjust a discharging speed of a voltage v_TBLT of a signal TBLT (FIGS. 2-3) on tracking bit line BLT (FIG. 2) to be substantially similar to a discharging speed of a signal on a bit line (e.g., BL FIG. 2) of memory array 116. BL adjust circuit 122 (FIG. 2) is configured to adjust a voltage v_BL on bit line BL (FIG. 2) based on a voltage v_EMU of emulation signal EMU (FIGS. 2-3), which improves the performance of BLT tracking circuit 104.

In FIG. 1, tracking array 102 includes tracking cells (FIG. 2) arranged, e.g., in a column. Each of the tracking cells is coupled to a tracking bit line BLT (FIG. 2). In some embodiments, each tracking cell of tracking array 102 has substantially the same structure and substantially the same performance parameters (e.g., representing impedance or resistance-capacitance loading) as that of the memory cells of memory array 116. BLT tracking circuit 104 uses a voltage v_BLT (FIG. 2) of tracking bit line BLT of track array 102 to estimate a voltage drop of a bit line BL (FIG. 2) of memory array 116 and thereby operate memory device 100 faster and/or more efficiently. Operation related to tracking array 102 is described below in more detail with respect to FIG. 2.

Figure 3:
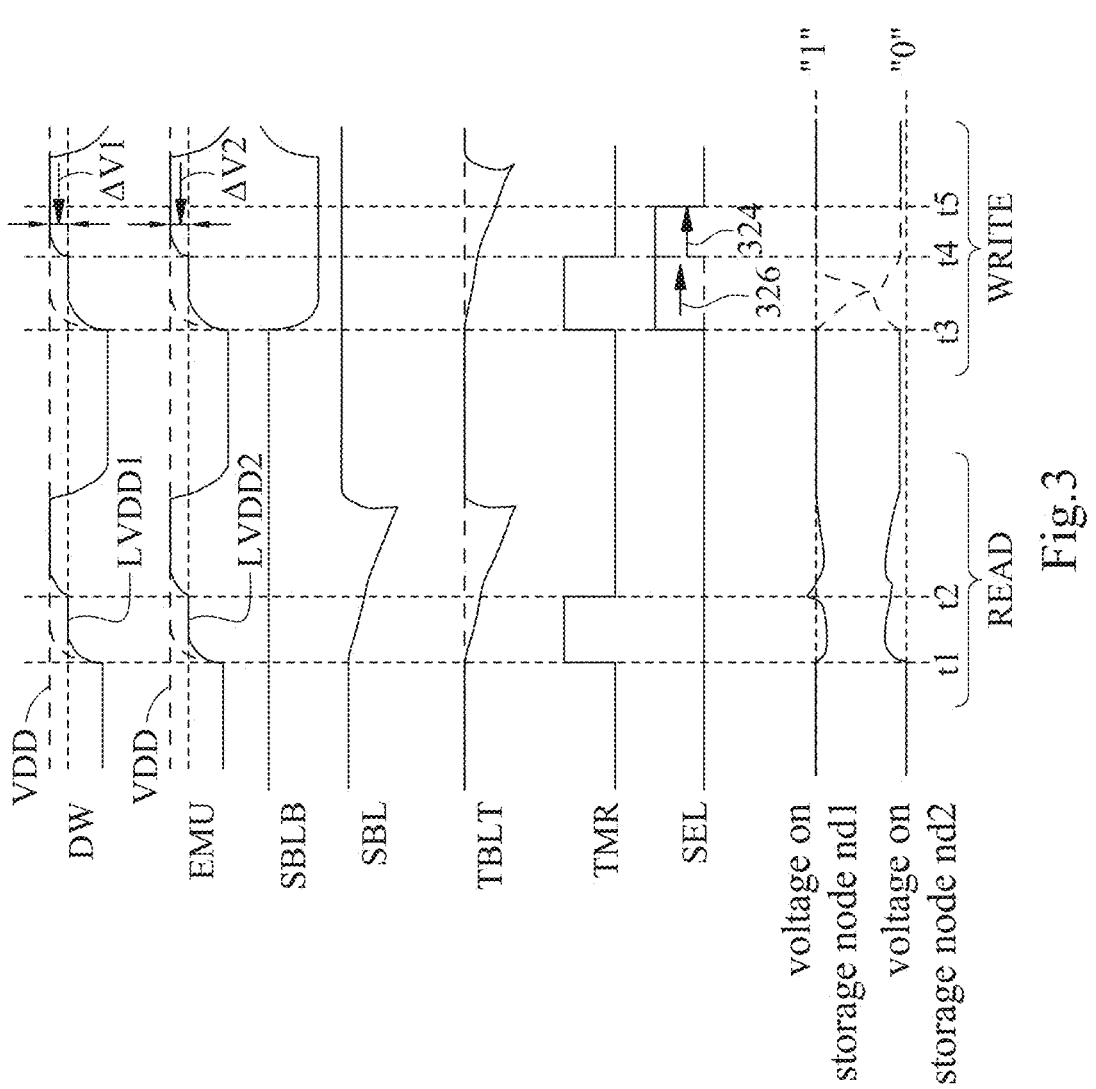
FIG. 3 is a timing diagram that includes waveforms, in accordance with some embodiments.

BLT tracking circuit 104 has an input coupled to receive tracking bit_bar line voltage v_BLT on tracking bit line BLT of tracking array 102. BLT tracking circuit 104 is configured to sense a drop in tracking bit_bar line voltage v_BLT and send voltage drop information to adjust timer 106. Based on the voltage drop information from BLT tracking circuit 104, adjust timer 106 is configured to generate a timing signal TMR (FIGS. 2-3). Timing signal TMR is provided to each of control adjust circuit 108(1), bias selector 112 and adjust circuit 108(2). During a first period of time (FIG. 3) of the READ cycle or the WRITE cycle, and in response to timing signal TMR, each of the following is true: adjust circuit 108(1) adjusts a voltage v_DW of a signal DW (FIGS. 2-3) on word line WL (FIG. 2) asserted by WL driver 110(1); and adjust circuit 108(2) adjusts a voltage v_EMU of a signal EMU (FIGS. 2-3) on tracking word line TWL asserted by TWL driver 110(2). Adjust circuit 122 is configured to adjust a voltage v_BL of a signal BL (FIGS. 2-3) on a bit line BL (FIG. 2) based on voltage v_EMU of signal EMU (FIGS. 2-3) on tracking word line TWL.

In FIG. 1, also during a second period of time (FIG. 3) of the WRITE cycle, and in response to timing signal TMR, bias selector 112 is configured to generate a selection signal SEL (FIGS. 2-3) that controls which one of a write-assist voltage VWA (FIG. 2) or a reference voltage, e.g., VDD (FIG. 2) is applied to a power rail CVDD (FIG. 2) via multiplexer 114. In sum, based upon the information obtained from tracking array 102, the operation conditions of memory array 116 are estimated to facilitate applying various READ and WRITE adjust schemes to memory array 116, such as reducing an asserted voltage of signal DW on word line WL, or reducing a voltage applied to power rail CVDD, or the like.

FIG. 2 is a schematic diagram of a memory device 200, in accordance with some embodiments.

Memory device 200 is an example of memory device 100. Memory array 116 includes memory cells arranged in M rows and N columns, M×N, where each of M and N is a positive integer. An example of the memory cells of memory array 116 is memory cell 206. FIG. 2 assumes that memory cell 206 is a six transistor (6T) memory cell. In some embodiments, each of the memory cells has a configuration other than the 6T memory cell shown in FIG. 2. In FIG. 2, tracking array 102 is arranged as a one-dimensional array, e.g., as a column. In some embodiments, tracking array 102 is a two-dimensional array.

Memory cell 206 includes a latch and two metal-oxide field-effect transistors (MOSFETs) having negative channels (NFETs), namely NFETS N13 and N14. NFET N13 is electrically coupled (hereinafter, "coupled") between a bit line BL and a first storage node nd1 of the latch. NFET N14 is coupled between a bit_bar line BLB and a second storage node nd2 of the latch. In a normal operating mode, the logical state of storage node nd2 is the complement of the logical state of storage node nd1, i.e., if the logical state of storage node nd1 is low then the logical state of node nd2 is high, and vice-versa. In some embodiments, each of NFETs N13 and N14 is referred to as a pass gate. The bit line BL is coupled not only to memory cell 206 but to the other ones of the memory cells (not shown) in the corresponding column of memory array 116. The bit_bar line BLB is coupled not only to memory cell 206 but to the other ones of the memory cells (not shown) in the corresponding column of memory array 116. The gate terminals of pass gates N13 and N14 are coupled to word line WL.

In FIG. 2, the latch of memory cell 206 includes first and second inverters which are cross-coupled. The first inverter includes: a MOSFET having a positive channel (PFET) P11 coupled between power rail CVDD and storage node nd1; and an NFET N11 coupled between storage node nd1 and a reference voltage, e.g., VSS, ground (GND), or the like. The second inverter includes: a PFET P12 coupled between power rail CVDD and storage node nd2; and an NFET N12 coupled between storage node nd2 and reference voltage VSS. The gate terminals of PFET P11 and NFET N11 of the first inverter are coupled to storage node nd2 of the second inverter. The gate terminals of PFET P12 and NFET N12 of the second inverter are coupled to storage node nd1 of the first inverter. Hence, the first and second inverters are referred to as being cross-coupled with respect to each other. In some embodiments, PFETs P11 and P12 are referred to as pull-down transistors and NFETs N11 and N12 are referred to as pull-up transistors.

An example of the tracking cells in tracking array 102 is tracking cell 202. The tracking cells of tracking array 102 have substantially the same structure and substantially the same performance parameters as that of the memory cells of memory array 116. As such, tracking cell 202 has substantially the same structure and substantially the same performance parameters as memory cell 206. PFETs P13-P14, NFETs N13-N16 and storage nodes nd3-nd4 of tracking cell 202 correspond to PFETs P11-P12, NFETs N11-N12 and storage nodes nd1-nd2 of memory cell 206. Tracking bit line BLT of tracking cell 202 corresponds to, and is configured to emulate, bit_bar line BLB of memory cell 206. Tracking bit_bar line BLBT of tracking cell 202 corresponds to, and is configured to emulate, tracking bit line BL of memory cell 206. The gate terminals of pass gates N15 and N16 are coupled to word line WL. As such, the gate terminals of pass gates N15 and N16 of tracking cell 202 are coupled to the gate terminals of pass gates N13 and N14 of memory cell 206. In some embodiments, PFETs P13 and P14 are referred to as pull-down transistors and NFETs N13 and N14 are referred to as pull-up transistors.

In memory array 116 of FIG. 2: the memory cells (e.g., 206) in a row are coupled to a corresponding one of the word lines (e.g., WL); and the memory cells (e.g., 206) in column are coupled to a corresponding one of the bit lines (e.g., BL) and a corresponding one of the bit_bar lines (e.g., BLB). In some embodiments, a voltage v_BLB on bit_bar line BLB represents a logical state which is substantially the logical complement (or logical inverse) of the logical state represented by the voltage v_BL on the corresponding bit line BL. The voltage on bit line BL determines the READ and WRITE margins of an SRAM cell. In some embodiments, the voltage on bit_bar line BLB determines the READ and WRITE margins of an SRAM cell. The relationship between the voltage on bit line BL and the READ and WRITE margins will be described in detail with respect to FIG. 5.

WL driver 110(1) includes a 'this-row-select' (TRS) detector 218 and an inverter, the latter including a PFET P1 and an NFET N1. TRS detector 218 is configured to detect when a READ address or a WRITE address selects the corresponding row of memory array 116. For example, such a selection is for purposes of either a READ operation or a WRITE operation targeting one of the memory cells (e.g., 206) in the selected row. In some embodiments, TRS detector 218 includes an address decoder. An output of TRS detector 218 is coupled to an input of the inverter of WL driver 110(1). An output of the inverter of WL driver 110(1) is coupled to word line WL. Upon detecting that the corresponding row has been selected, TRS detector 218 is configured to reduce/lower its output signal, which causes the inverter of WL driver 110(1) not only to generate a driving signal on word line (signal DW) but also increase/raise a voltage v_DW of signal DW (FIG. 3) on word line WL to a level which is sufficient to turn on each of pass gates N13 and N14.

In FIG. 2, for example, during a WRITE operation, bit line BL and bit_bar line BLB are set to opposite logical states according to new data that will be written into memory cell 206. When memory cell 206 is selected, a logic high state is applied to WL accordingly, which turns on pass gates N13 and N14 thereby coupling storage nodes nd1 and nd2 of the latch of memory cell 206 correspondingly to bit line BL and bit_bar line BLB. As a result, the logic values on bit line BL and bit_bar line BLB are written (transferred therefrom) into storage nodes nd1 and nd2.

Adjust circuit 108(1) is coupled between word line WL and adjust timer 106. In FIG. 2., adjust circuit 108(1) includes an NFET N3 coupled between word line WL and reference voltage VSS. A gate terminal of NFET N3 is coupled to receive a timing signal TMR generated by adjust timer 106 that turns NFET N3 on for a portion of a READ operation (FIG. 3) or a portion of a WRITE operation (FIG. 3) thereby to adjust voltage v_DW of signal DW on word line WL. Timing signal TMR is also received by adjust circuit 108(2) and bias selector 112, as discussed below. In some embodiments, NFET N3 is configured to receive a control signal (not shown) that turns NFET N3 on for an entire duration of a READ operation or for an entire duration of a WRITE operation. In some embodiments, NFET N3 has an always-on configuration, e.g., in which the gate terminal is coupled, e.g., to reference voltage VDD. In some embodiments, a PFET is used instead of NFET N3, and the waveform of timing signal TMR is inverted accordingly.

In FIG. 2, adjust circuit 108(2) is coupled between tracking word line TWL and reference voltage VSS. In FIG. 2., adjust circuit 108(2) includes an NFET N4 coupled between tracking word line TWL and reference voltage VSS. A gate terminal of NFET N4 is coupled to receive timing signal TMR that turns NFET N4 on for a portion of a READ operation (FIG. 3) or a portion of a WRITE operation (FIG. 3) thereby to adjust voltage v_EMU of emulation signal EMU on tracking word line TWL. In some embodiments, NFET N4 is configured to receive a control signal (not shown) that turns NFET N4 on for an entire duration of a READ operation or for an entire duration of a WRITE operation. In some embodiments, NFET N4 has an always-on configuration, e.g., in which the gate terminal is coupled, e.g., to reference voltage VDD. In some embodiments, a PFET is used instead of NFET N4, and the waveform of timing signal TMR is inverted accordingly.

In some embodiments, adjust circuit 108(2) is configured to adjust voltage v_EMU of emulation signal EMU on tracking line TWL substantially the same as adjust circuit 108(1) is configured to adjust voltage v_DW of signal DW on word line WL. In some embodiments, adjust circuit 108(2) is configured to have substantially a same operational profile as an operational profile exhibited by adjust circuit 108(1). In some embodiments, NFET N4 is configured to have substantially a same operational profile as an operational profile exhibited by NFET N3, e.g., in terms of various combinations of parameters such as current-conducting capacity, channel length, threshold voltage, or the like.

Bias selector 112 is configured to receive timing signal TMR. In response to timing signal TMR, bias selector 112 is configured to generate a selection signal SEL (FIG. 3) and output the same to multiplexer 114. In response to selection signal SEL (FIG. 3), multiplexer 114 selectively couples either write-assist voltage VWA or reference voltage VDD to power rail CVDD.

In FIG. 2, tracking word line TWL is configured to represent substantially the same impedance, resistance-capacitance loading, or the like, as word line WL. In some embodiments, a total length of tracking word line TWL is substantially the same as a total length of word line WL, and a width of segments that comprise the tracking word line TWL is substantially the same as the width of segments that comprise the word line WL, where width is measured relative to a short axis of such segments. In such embodiments, a signal transmitted through tracking word line TWL experiences a propagation delay similar to a propagation delay experienced by a signal transmitted from word line driver 110(1) through word line WL across memory array 116 to a corresponding memory cell in one of the columns of memory array 116. In such embodiments, a transfer function representing the effects of tracking word line TWL on a signal propagating therethrough is similar to a transfer function representing the effects of word line WL on a signal propagating therethrough.

An input end of tracking word line TWL is configured receives a signal pre-EMU from TWL driver 110(2). In FIG. 2, tracking word line TWL includes a first line segment seg(1), a second line segment seg(2) and a third line segment seg(3) connected in series. Second line segment seg(2) is connected between first line segment seg(1) and third line segment seg(3). In some embodiments, a total length of tracking word line TWL, i.e., a sum of the lengths of first line segment seg(1), second line segment seg(2), and third line segment seg(3), is configured to be similar to the width of the N columns in memory array 116. In some embodiments, the sum of the lengths of line segments seg(1)-seg(3) is substantially the same as a total length of word line WL.

Regarding tracking word line TWL of FIG. 2, in some embodiments, the length of first line segment seg(1) is substantially equal to about half of a width of memory array 116, i.e., the width of about N/2 columns of memory array 116. In some embodiments, the length of third line segment seg(3) is also substantially equal to about half of the width of memory array 116. For example, if memory array 116 has 32 columns, the length of first line segment seg(1) (and also the length of third line segment seg(3)) is configured to substantially equal to a width of 16 columns in memory array 116 For example, if memory array 116 has 128 columns, then the length of first line segment seg(1) (and also the length of third line segment seg(3)) is configured to be substantially equal to a width of 64 columns in memory array 116. In some embodiments, the length of first line segment seg(1) (and also the length of third line segment seg(3)) is based on the size of memory array 116. A total length of tracking word line TWL is similar to a total length of one of the word lines (e.g, WL) of memory array 116.

TWL driver 110(2) includes an 'any-row-select' (ARS) detector 220 and an inverter, the latter including a PFET P3 and an NFET N8. ARS detector 220 is configured to detect when a READ address or a WRITE address selects any row of memory array 116. For example, such a selection is for purposes of either a READ operation or a WRITE operation targeting one of the memory cells (e.g., 206) in the selected row. In some embodiments, ARS detector 220 includes an address decoder. An output of ARS detector 220 is coupled to an input of the inverter of TWL driver 110(2). An output of the inverter of TWL driver 110(2) is configured to generate signal pre_EMU and is coupled to a first end of tracking word line TWL. Upon detecting that a row has been selected, ARS detector 220 is configured to reduce/lower its output signal, which causes the inverter of WL driver 110(1) to increase/raise a voltage v_pre_EMU of signal pre_EMU which is input to tracking word line TWL, and thus to increase/raise a voltage v_EMU of signal EMU (FIG. 3) which is output from tracking word line TWL.

BL adjust circuit 122 is configured to receive emulation signal EMU from tracking word line TWL. Based on emulation signal EMU, BL adjust circuit 122 is configured to adjust voltage v_BL on bit line BL. In FIG. 2, BL adjust circuit 122 has a quasi-inverter configuration. BL adjust circuit 122 includes a PFET P2 and NFETS N5, N6 and N7. PFET P2 is coupled between reference voltage VDD and an output node of BL adjust circuit 122 at a node nd5. Output node nd5 of BL adjust circuit 122 is coupled to tracking bit line BLT. A first source/drain (S/D) terminal of NFET N5 is coupled to node nd5 and a second S/D terminal of NFET N5 is coupled to a first S/D terminal of NFET N6. A second S/D terminal of NFET N6 is coupled to a first S/D terminal of NFET N7. A second S/D terminal of NFET N7 is coupled to reference voltage VSS. Gate terminals of each of PFET P2 and NFETs N5-N7 are coupled to an input of BL adjust circuit 122 and thus to emulation signal EMU. BL adjust circuit 122 is controlled by emulation signal EMU. BL adjust circuit 122 is configured to discharge a voltage level on node nd5 according to emulation signal EMU, which thereby adjusts a voltage v_TBLT of signal TBLT on tracking bit line BLT of tracking cell 202. In some embodiments, an NFET is used instead of PFET P2 and corresponding PFETs are used instead of NFETs N5-N7, and the waveform of signal pre-EMU and thus emulation signal EMU are inverted accordingly.

When emulation signal EMU reaches a level which is sufficient to turn on NFETs N4-N6 and also to turn off the PFET P2, BL adjust circuit 122 begins to discharge/reduce the voltage on node nd5, which discharges/reduces voltage v_TBLT of signal TBLT on tracking bit line BLT, thereby adjusting (or manipulating) the waveform of signal TBLT. In some embodiments, a quantity of NFETs in BL adjust circuit 122 is substantially equal to a quantity of NFETs included in a counterpart signal path (not shown), e.g., a counterpart discharging path, in another part of memory device 200. In some embodiments, BL adjust circuit 122 is configured to emulate the counterpart signal path (not shown). In some embodiments, the quantity of NFETs in BL adjust circuit 122 is proportional to the quantity of NFETs included in the counterpart signal path (not shown). In some embodiments, a quantity of tracking cells (e.g., 202) in tracking array 102 that are coupled to tracking bit line BLT is substantially equal to a quantity of rows in memory array 116, i.e., is substantially equal to N. For example, if memory array 116 includes 256 rows such that N=256, tracking bit line BLT is coupled with a total of 256 tracking cells in tracking array 102.

In FIG. 2, tracking array 102 is used to estimate (or track) a change in voltage v_SBL of a signal SBL on bit line BL of memory array 116. During a READ or WRITE operation of memory array 116, a tracking operation occurs at tracking array 102. The tracking operation is applied to one of the tracking cells (e.g., 202) of tracking array 102. In some embodiments, more particularly, the tracking operation is applied to the tracking cells of tracking array 102 for purposes of compensating for operation and process variations that otherwise affect a READ or a WRITE operation performed on memory array 116. In some embodiments, the average drop in voltage v_TBLT of signal TBLT on tracking bit line BLT is used as an estimate of the voltage drop of signal SBL on bit line BL of memory array 116. BLT tracking circuit 104 is configured to detect the drop of voltage v_TBLT of signal TBLT on tracking bit line BLT. In some embodiments, BLT tracking circuit 104 includes a comparator (not shown) configured to compare voltage v_TBLT of signal TBLT on tracking bit line BLT against a predetermined reference voltage. When voltage v_TBLT reaches the predetermined reference voltage, BLT tracking circuit 104 generates a control signal and outputs the same to adjust timer 106. In some embodiments, BLT tracking circuit 104 generates a control signal by changing a logical state of the signal being output from BLT tracking circuit 104 to adjust timer 106.

FIG. 3 is a timing diagram that includes waveforms, in accordance with some embodiments.

In FIG. 3, the behaviors of the various waveforms are shown during a READ cycle and a during WRITE cycle in which memory cell 206 of memory array 116 is correspondingly selected. Regarding the READ cycle, at a first time instance t1, when the leading edge of a READ clock signal (not shown) arrives, WL driver 110(1) drives word line WL. Accordingly, voltage v_DW on signal DW begins to rise from a low voltage towards a voltage VDD. Also when the leading edge of a READ clock signal (not shown) arrives, TWL driver 110(2) drives tracking word line TWL. Accordingly, voltage v_TWL on tracking word line TWL begins to rise from a low voltage towards voltage VDD.

Figure 4A:
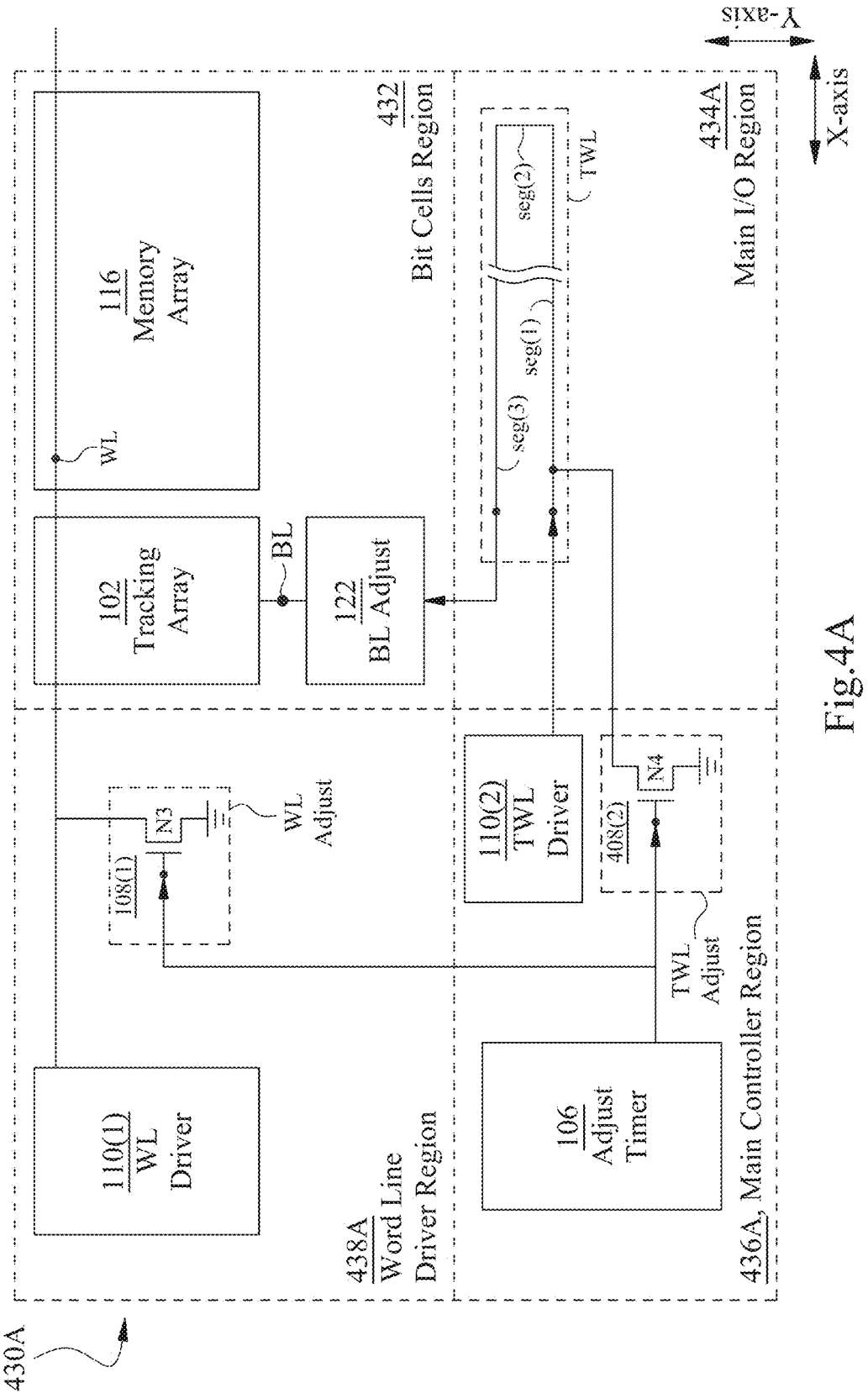
FIGS. 4A-4C are floorplan diagrams, in accordance with some embodiments.
Figure 4B:
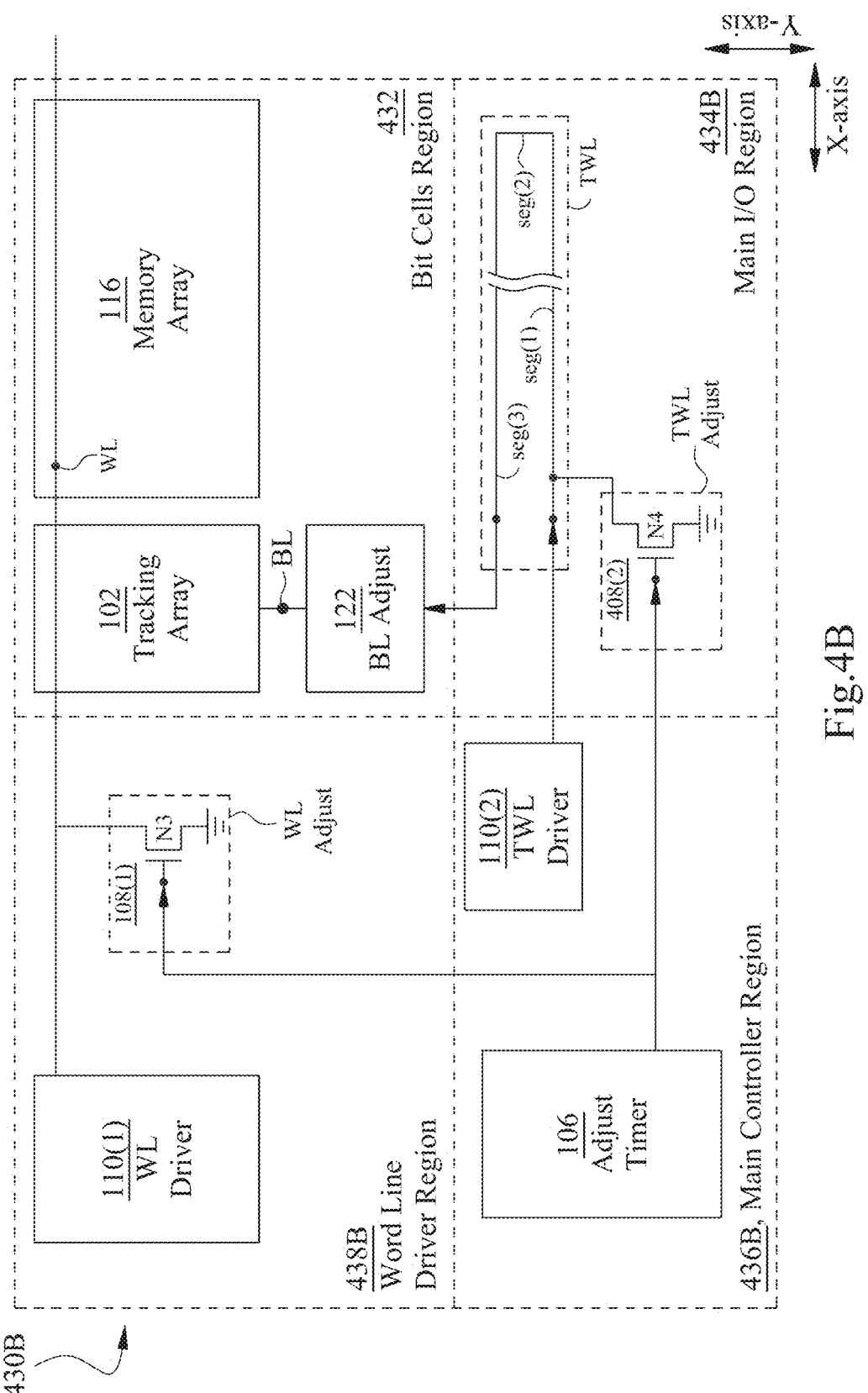
Figure 4C:
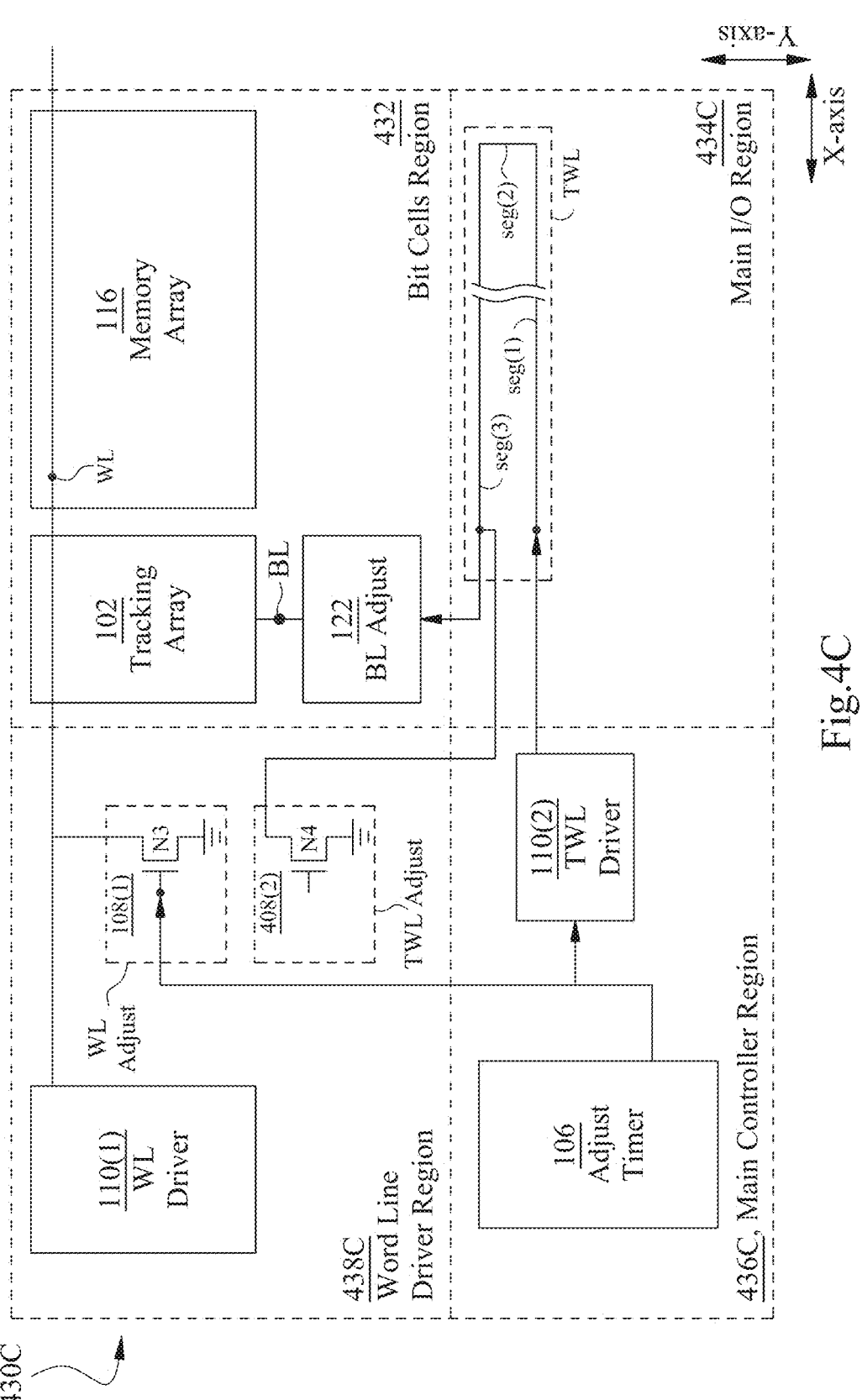

At substantially the same time, i.e., at substantially first time instance t1, adjust timer 106 changes timing signal TMR from a logical low state to a logical high state. In response to timing signal TMR changing to the logical high state substantially at first time instance t1, each of adjust circuit 108(1) and adjust circuit 108(2) turns on. More particularly, in response to the change to the logical high state of timing signal TMR substantially at first time instance t1, NFET N3 turns on and pulls voltage v_DW of signal DW on word line WL towards VSS, an effect of which limits the rise of voltage v_DW to reaching a lower voltage LVDD1, where LVDD1<VDD, ΔV1=VDD−LVDD1, and 0<ΔV1. Turning on NFET N3 hinders voltage v_DW of signal DW from reaching voltage VDD by capping voltage v_DW at LVDD1 albeit temporarily while NFET N3 is turned on. As a result, temporarily while NFET N3 is turned on, voltage v_DW of signal DW on word line WL rises to, but is prevented from rising above, voltage LVDD1. Also in response to the change to the logical high state of timing signal TMR substantially at first time instance t1, NFET N4 turns on and pulls voltage v_EMU of emulation signal EMU on tracking word line TWL towards VSS, an effect of which limits the rise of voltage v_EMU to reaching lower voltage LVDD2, where LVDD2<VDD, ΔV2=VDD−LVDD2, 0<ΔV2, LVDD2≈LVDD1 and thus ΔV2≈ΔV1. The value of LVDD2 achievable using adjust circuit 108(2) varies depending upon the region in which adjust circuit 108(2) is located (FIGS. 4A-4C). Turning on NFET N4 hinders voltage v_EMU of signal EMU from reaching voltage VDD by capping voltage v_EMU at LVDD2 albeit temporarily while NFET N4 is turned on. As a result, during the READ cycle and temporarily while NFET N4 is turned on, voltage v_EMU on tracking word line TWL rises to, but is prevented from rising above, voltage LVDD2.

Despite being capped temporarily at the relatively lower voltage LVDD1, voltage v_DW of signal DW on word line WL is sufficient to turn on pass gate transistors N13 and N14 of memory cell 206. An advantage of using LVDD1 rather than VDD to turn on pass gates N13 and N14 is that power consumption during the READ operation is reduced as compared to a situation in which a counterpart memory device did not include adjust circuit 108(1). The memory device of the other approach which does not include a counterpart for adjust circuit 108(2) would produce a signal on the counterpart tracking word line which has a voltage VDD between time instances t1 and t2 of the READ cycle, i.e., produces a voltage mismatch in the amount of ΔV2 (mismatch ΔV2) between the signal on the counterpart tracking word line and the signal on the counterpart word line between time instances t1 and t2 of the READ cycle. Voltage mismatch ΔV2 suffered according to the other approach between time instances t1 and t2 of the READ cycle reduces the accuracy of the emulation by the counterpart tracking word line of the signal on the counterpart word line. An advantage of including adjust circuit 108(2) in memory device 200 is that the emulation of word line WL by tracking word line TWL is made more accurate as compared to the other approach, e.g., because voltage mismatch ΔV2 is not suffered, i.e., is avoided between time instances t1 and t2 of the READ cycle. The emulation accuracy of signal EMU (output by tracking line TWL) is improved because voltage v_EMU of simulation signal EMU of tracking word line TWL is pulled temporarily towards VSS by adjust circuit 108(2) in substantially the same manner in which voltage v_DW of signal DW is pulled temporarily towards VSS by adjust circuit 108(1).

In FIG. 3, as an example, it is assumed that storage node nd1 of memory cell 206 stores a logical one/high and storage node nd2 of memory cell 206 correspondingly stores a logical zero/low at the start of the READ operation. Beginning at the first time instance t1, bit line BL starts to drop because the logical low stored at storage node nd1 discharges bit line BL via the turned-on pass gate NFET N13 whereas bit_bar line BLB does not drop because of the logical high value stored at node nd2. In some embodiments, tracking cell 202 performs a READ "0" operation in response to the leading edge of the READ clock (not shown). In FIG. 3, the waveform of signal TBLT on tracking bit line BLT is similar to the waveform of signal SBL on bit line BL of memory cell 206 because, as described above, the structure and parameters of tracking cell 202 are substantially the same as that of memory cells (e.g., 206) in memory array 116.

In response to the READ clock signal (not shown), bias selector 112 ignores timing signal TMR. As such, bias selector 112 does not respond to the change in logical state timing signal TMR substantially at first time instance t1 from the logical low state to the logical high state. Rather, bias selector 112 maintains selection signal SEL in the logical low state during the READ cycle.

In FIG. 3, from first time instance t1 until second time instance t2, voltage v_DW of signal DW on word line WL is capped at LVDD1. Similarly, from first time instance t1 until second time instance t2, voltage v_EMU of signal EMU on word line TWL is capped at LVDD2.

At second time instance t2, as soon as BLT tracking circuit 104 detects that voltage v_TBLT of signal TBLT on tracking bit line BLT voltage reaches a predetermined threshold, BLT tracking circuit 104 changes a state of the control signal being output to adjust timer 106. In response to the change in state of the control signal, adjust timer 106 changes timing signal TMR from a logical high state to a logical low state. In response to timing signal TMR having the logical low state, and substantially at second time instance t2, NFET N3 of adjust circuit 108(1) is turned off. Once turned off, NFET N3 no longer hinders voltage v_DW of signal DW on word line WL from rising. Consequently, voltage v_DW of signal DW on word line WL rises from LVDD1 to voltage VDD shortly after second time instance t2.

Also in response to timing signal TMR having the logical low state, and substantially at second time instance t2, NFET N4 of adjust circuit 108(2) is turned off. Once turned off, NFET N4 no longer hinders voltage v_EMU of emulation signal EMU on tacking word line TWL from rising. Consequently, voltage v_EMU of signal EMU on tracking word line TWL rises from LVDD2 to voltage VDD shortly after second time instance t2.

As reflected in FIG. 3, an advantage of including adjust circuit 108(2) in memory device 200 is that a READ disturbance is better avoided. As shown in the waveforms representing correspondingly voltages on storage nodes nd1 and nd2, a READ disturbance of the voltages correspondingly on storage nodes nd1 and nd2 reduced and thus better avoided by employing adjust circuits 108(1) and 108(2), as described above.

After the READ cycle, and before the WRITE cycle, each of voltage v_BL of signal BL on bit line BL and voltage v_BLB of signal BLB on bit_bar line BLB is precharged to the logical high state. To extend the example, it is assumed that the WRITE cycle will store/write a logical zero/low in storage node nd1 of memory cell 206 and correspondingly store/write a logical one/high in storage node nd2 of memory cell 206.

In FIG. 3, the WRITE cycle begins at a third time instance t3. When the leading edge of a WRITE clock signal (not shown) arrives, WL driver 110(1) drives word line WL. Accordingly, voltage v_DW on signal DW begins to rise from a low voltage towards voltage VDD. Also when the leading edge of a WRITE clock signal (not shown) arrives, TWL driver 110(2) drives tracking word line TWL. Accordingly, voltage v_TWL on tracking word line TWL begins to rise from a low voltage towards voltage VDD.

At substantially the same time, i.e., at substantially third time instance t3, adjust timer 106 changes timing signal TMR from the logical low state to the logical high state. In response to the logical high state of timing signal TMR substantially at third time instance t3, each of adjust circuit 108(1) and adjust circuit 108(2) turns on. More particularly, in response to the logical high state of timing signal TMR, NFET N3 turns on and pulls voltage v_DW of signal DW on word line WL towards VSS, an effect of which limits the rise of voltage v_DW to reaching lower voltage LVDD1, where LVDD1<VDD. Turning on NFET N3 hinders voltage v_DW of signal DW from reaching voltage VDD by capping voltage v_DW at LVDD1 albeit temporarily while NFET N3 is turned on. As a result, temporarily while NFET N3 is turned on, voltage v_DW of signal DW on word line WL rises to, but is prevented from rising above, voltage LVDD1. Also in response to the logical high state of timing signal TMR, NFET N4 turns on and pulls voltage v_EMU of emulation signal EMU on tracking word line TWL towards VSS, an effect of which limits the rise of voltage v_EMU to reaching lower voltage LVDD2. Again, LVDD2≈LVDD1 and the value of LVDD2 achievable using adjust circuit 108(2) varies depending upon the region in which adjust circuit 108(2) is located (FIGS. 4A-4C). Also, again, LVDD2<VDD, ΔV2=VDD−LVDD2, 0<ΔV2, and thus ΔV2≈ΔV1. Turning on NFET N4 hinders voltage v_EMU of signal EMU from reaching voltage VDD by capping voltage v_EMU at LVDD2 albeit temporarily while NFET N4 is turned on. As a result, during the WRITE cycle and temporarily while NFET N4 is turned on, voltage v_EMU on tracking word line TWL rises to, but is prevented from rising above, voltage LVDD2.

In response to the WRITE clock signal (not shown), bias selector 112 stops ignoring timing signal TMR. In response to the change to the logical high state of timing signal TMR substantially at third time instance t3, bias selector 112 changes selection signal SEL from a logical low state to a logical high state. In response to the change to the logical high state of selection signal SEL, multiplexer 114 changes the voltage coupled to power rail CVDD, i.e., ceases coupling voltage VDD to power rail CVDD and instead couples write-assist voltage VWA to power rail CVDD. When not undergoing the WRITE cycle, bias selector 112 maintains selection signal SEL in a logical low state. Accordingly, when not undergoing the WRITE cycle, multiplexer 114 is controlled to couple voltage VDD rather than voltage VWA to power rail CVDD. Voltage VWA is less than voltage VDD, i.e., VWA<VDD. By coupling power rail CVDD to a lower voltage during a WRITE operation, the WRITE operation is performed faster and/or more easily.

Despite being capped temporarily at the relatively lower voltage LVDD1, voltage v_DW of signal DW on word line WL is sufficient to turn on pass gate transistors N13 and N14 of memory cell 206. An advantage of using LVDD1 rather than VDD to turn on pass gates N13 and N14 is that power consumption during the WRITE operation is reduced as compared to a situation in which a counterpart memory device did not include adjust circuit 108(1). The memory device of the other approach which does not include a counterpart for adjust circuit 108(2) would produce a signal on the counterpart tracking word line which has a voltage VDD between time instances t3 and t4 of the WRITE cycle, i.e., produces a voltage mismatch in the amount of ΔV2 (mismatch ΔV2) between the signal on the counterpart tracking word line and the signal on the counterpart word line between time instances t3 and t4 of the WRITE cycle. Voltage mismatch ΔV2 suffered according to the other approach between time instances t3 and t4 of the WRITE cycle reduces the accuracy of the emulation by the counterpart tracking word line of the signal on the counterpart word line. An advantage of including adjust circuit 108(2) in memory device 200 is that the emulation of word line WL by tracking word line TWL is made more accurate as compared to the other approach, e.g., because voltage mismatch ΔV2 is not suffered, i.e., is avoided between time instances t3 and t4 of the WRITE cycle. The emulation accuracy of signal EMU (output by tracking line TWL) is improved because voltage v_EMU of simulation signal EMU of tracking word line TWL is pulled temporarily towards VSS by adjust circuit 108(2) in substantially the same manner in which voltage v_DW of signal DW is pulled temporarily towards VSS by adjust circuit 108(1).

Returning to the example, in order to reset the logical state of memory cell 206 as part of the WRITE cycle, voltage v_BLB of bit_bar line BLB is set to a logical low state. In some embodiments, tracking cell 202 performs a READ "0" operation in response to the leading edge of the WRITE clock (not shown). In FIG. 3, voltage v_DW of signal DW on word line WL stays at LVDD1 until a fourth time instance t4.

In FIG. 3, at fourth time instance t4, as soon as BLT tracking circuit 104 detects that voltage v_TBLT of signal TBLT on tracking bit line BLT reaches the predetermined threshold, BLT tracking circuit 104 changes the state of the control signal being output to adjust timer 106. In response to the change in state of the control signal, adjust timer 106 changes timing signal TMR from a logical high state to a logical low state substantially at fourth time instance t4. In response to timing signal TMR having the logical low state, and substantially at fourth time instance t4, NFET N3 of adjust circuit 108(1) is turned off. Once turned off, NFET N3 no longer hinders voltage v_DW of signal DW on word line WL from rising. Consequently, voltage v_DW of signal DW on word line WL rises from LVDD1 to voltage VDD shortly after fourth time instance t4.

Also in response to timing signal TMR having the logical low state, and substantially at fourth time instance t4, NFET N4 of adjust circuit 108(2) is turned off. Once turned off, NFET N4 no longer hinders voltage v_EMU of emulation signal EMU on tacking word line TWL from rising. Consequently, voltage v_EMU of signal EMU on tracking word line TWL rises from LVDD2 to voltage VDD shortly after fourth time instance t4.

Also, in a delayed response to the change in timing signal TMR from the high logical state to the logical low state, and substantially at a fifth time instance t5, bias selector 112 changes selection signal SEL from a logical high state to a logical low state. The time elapsed between fourth time instance t4 and fifth time instance t5 is represented by delay 324. In response to the change to the logical low state of selection signal SEL, multiplexer 114 changes the voltage coupled to power rail CVDD, i.e., ceases coupling write-assist voltage VWA to power rail CVDD and instead couples voltage VDD to power rail CVDD.

Bias selector 112 is configured to generate two different versions of selection signal SEL depending on whether the WRITE operation is a high speed type of WRITE operation or a low speed type of WRITE operation.

FIG. 3 assumes that the WRITE cycle is based upon a high speed SRAM operation. More particularly, when the WRITE operation is of the higher speed type (and thus a higher power consumption type), bias selector 112 generates a relatively wider/longer version of selection signal SEL in that the state of selection signal SEL is changed to the logical high state at fourth time instance t4. On the other hand, when the WRITE operation is of the slower speed type (and thus a lower power consumption type), bias selector 112 generates a relatively narrower/shorter version of selection signal SEL by waiting to change the state of selection signal SEL to the logical high state until a fifth time instance t5. Such a delay in changing the state of selection signal SEL is shown in a phantom/dashed line in FIG. 3 as a delay 326.

FIGS. 4A-4C are corresponding floorplan diagrams 430A-430C, in accordance with some embodiments.

More particularly, each of floorplan diagrams 430A-430C represents an orthographic projection of a corresponding memory device onto a reference plane, e.g., a plane defined by the X-axis and the Y-axis. The memory device of each of FIGS. 4A-4C is an example of memory device 100 of FIG. 1 albeit where some of the components of memory device 100 are not shown in FIGS. 4A-4C. As such, each of floorplan diagrams 430A-430C is representative of the corresponding memory device. Structures in the memory devices are represented by patterns (also known as shapes) in floorplan diagrams 430A-430C. For simplicity of discussion, elements in each of floorplan diagrams 430A-430C will be referred to as if they are structures rather than patterns per se. The memory devices corresponding to floorplan diagrams 430A-430C are examples of memory device 100, memory device 200, or the like.

Each of floorplan diagrams 430A-430C is arranged into the following areas (regions) which are nonoverlapping of each other and include: bit cells region 432; main input/output (I/O) regions 434A/B/C; main controller region 436A/B/C; and word line driver region 438A/B/C. Each such region is continuous and, in general, defined by the components/circuits located therein, as discussed below.

In each of FIGS. 4A-4C: memory array 116, tracking array 102 and BL adjust circuit 122 are in bit cells region 432; tracking line TWL is in main I/O region 434A/B/C; TWL driver 110(2) and adjust timer 106 are in main controller region 436A/B/C; and WL driver 110(1) and adjust circuit 108(1) are in word line driver region 438A/B/C. By contrast, adjust circuit 408(2) is in a different region in corresponding FIGS. 4A-4C, where adjust circuit 408(2) is an example of adjust circuit 108(2). Typically, main I/O region 434A/B/C additionally includes I/O components/circuits by which the corresponding memory device communicates with other components/devices which do not comprise the corresponding memory device. In some embodiments, main controller region 436A/B/C additionally includes addressing decoders, e.g., row decoders and column decoders, or the like. In some embodiments, main controller region 436A/B/C additionally includes sense amplifiers, or the like. In some embodiments, main controller region 436A/B/C additionally includes timing control circuitry other than adjust timer 106. In some embodiments, BL adjust circuit 122 is in main controller region 436A/B/C. In some embodiments, BL adjust circuit 122 is in a region other than bit cells region 432 or main controller region 436A/B/C.

In each of FIGS. 4A-4B, adjust circuit 408(2) is in a different one of the non-overlapping regions, where adjust circuit 408(2) is an example of adjust circuit 108(2). The value of LVDD2 achievable using adjust circuit 408(2) varies depending upon the region in which adjust circuit 408(2) is located.

In floorplan diagram 430A of FIG. 4A, in addition to TWL driver 110(2) and adjust timer 106, adjust circuit 408(2) is in main controller region 436A. As such, in FIG. 4A, adjust circuit 408(2) and adjust circuit 408(1) are free from being in the same region, i.e., are not in the same region.

In floorplan diagram 430B of FIG. 4B, in addition to tracking line TWL, adjust circuit 408(2) is in main I/O region 434B. As such, in FIG. 4B, adjust circuit 408(2) and adjust circuit 408(1) are free from being in the same region, i.e., are not in the same region. Also as such, in FIG. 4B, adjust circuit 408(2) and tracking line TWL are in the same region, namely main I/O region 434B.

In floorplan diagram 430C of FIG. 4C, in addition to WL driver 110(1) and adjust circuit 408(1), adjust circuit 408(2) is in word line driver region 438C. As such, in FIG. 4C, adjust circuit 408(2) and adjust circuit 408(1) are in the same region, namely word line driver region 438C.

It is to be recalled that LVDD2 is a maximum value of voltage v_DW of signal DW (FIGS. 2-3) on word line WL (FIG. 2) asserted by WL driver 110(1), and that generally a lower value of LVDD2 facilitates lower power consumption of the corresponding memory device. The value of LVDD2 (FIG. 3) achievable using adjust circuit 408(2) varies, in part, based on the region in which adjust circuit 408(2) is located (FIGS. 4A-4C). The value of LVDD2 achievable with floorplan diagram 430C of FIG. 4C (LVDD2_430C) is lower (smaller) than the value of LVDD2 achievable with floorplan diagram 430B of FIG. 4B (LVDD2_430B) such that LVDD2_430C<LVDD2_430B. The value of LVDD2 achievable with floorplan diagram 430B of FIG. 4B is lower (smaller) than the value of LVDD2 achievable with floorplan diagram 430A of FIG. 4A (LVDD2_430A) such that LVDD2_430B<LVDD2_430A. Overall, LVDD2_430C<LVDD2_430B<LVDD2_430A.

Because LVDD2_430B<LVDD2_430A, the power consumption by the memory device having floorplan diagram 430B (pw_430B) is lower (smaller) than the power consumption by the memory device having floorplan diagram 430A (pw_430A) such that pw_430B<pw_430A. Because LVDD2_430C<LVDD2_430B, the power consumption by the memory device having floorplan diagram 430C (pw_430C) is lower (smaller) than the power consumption by the memory device having floorplan diagram 430B (pw_430B) such that pw_430C<pw_430B. Overall, pw_430C<pw_430B<pw_430A.

Recalling that $\Delta V2 = VDD - LVDD2$, the value of $\Delta V2$ achievable with floorplan diagram 430A of FIG. 4A ($\Delta V2\_430A$) is smaller than the value of $\Delta V2$ achievable with floorplan 430B of FIG. 4B ($\Delta V2\_430B$) such that $\Delta V2\_430A < \Delta V2\_430B$. The value of $\Delta V2$ achievable with floorplan 430B of FIG. 4B is smaller than the value of $\Delta V2$ achievable with floorplan 430C of FIG. 4C ($\Delta V2\_430C$) such that $\Delta V2\_430B < \Delta V2\_430C$. Overall, $\Delta V2\_430A < \Delta V2\_430B < \Delta V2\_430C$.

Figure 4D:
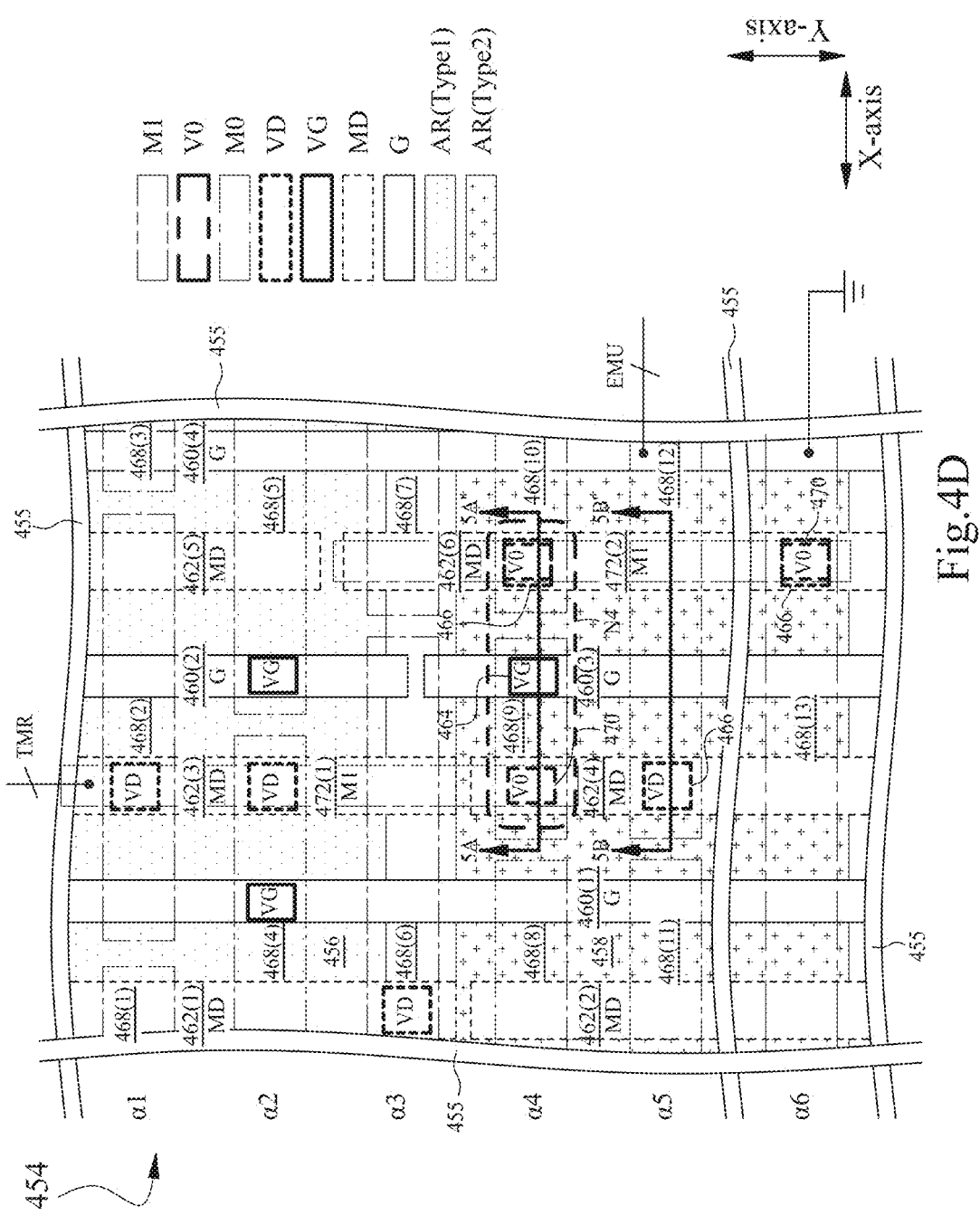
FIG. 4D is a layout diagram, in accordance with some embodiments.

FIG. 4D is a layout diagram of a portion 454 of a memory device, in accordance with some embodiments.

Regarding the semiconductor device of which the layout diagram of FIG. 4D represents portion 454 (as indicated by break lines 455), the semiconductor device more particularly is a memory device. Examples of the memory device of which layout diagram represents portion 454 include memory device 100 of FIG. 1, memory device 200 of FIG. 2, memory devices 430A-430C of corresponding FIGS. 4A-4C, or the like.

In general, a layout diagram represents a semiconductor device. Shapes in the layout diagram represent corresponding components in the semiconductor device. The layout diagram per se is a top view. Shapes in the layout diagram are two-dimensional relative to, e.g., the X-axis and the Y-axis, whereas the semiconductor device being represented is three-dimensional. Typically, relative to the Z-axis, the semiconductor device is organized as a stack of layers in which are located corresponding structures, i.e., to which belong corresponding structures. Accordingly, each shape in the layout diagram represents, more particularly, a component in a corresponding layer of the corresponding semiconductor device. Typically, the layout diagram represents relative depth, i.e., positions along the Z-axis, of shapes and thus layers by superimposing a second shape on a first shape so that the second shape at least partially overlaps the first shape. For simplicity of discussion, i.e., as a discussion-expedient, some elements in layout diagram FIG. 4D are referred to as if they are counterpart structures in a corresponding semiconductor device rather than patterns/shapes per se. For example, element 460(2) is referred to as gate structure 460(2) rather than as gate pattern 460(2).

Layout diagrams vary in terms of the amount of detail represented. In some circumstances, selected layers of a layout diagram are combined/abstracted into a single layer, e.g., for purposes of simplification. Alternatively, and/or additionally, in some circumstances, not all layers nor components therein of the corresponding semiconductor device are represented, i.e., selected layers of the layout diagram are omitted, e.g., for simplicity of illustration. For example, FIG. 4D omits via-to-M1 (V1) structures, M2 segments in a third layer of metallization (M2nd layer), or the like.

In FIG. 4D, in an active region (AR) layer 575(1) (FIGS. 5A-5B), represented portion 454 of the memory device (hereinafter "portion 454) includes ARs 456B and 458B that extend in a first direction, e.g., parallel to the X-axis. AR 456B has a first type of conductivity and AR 458B has a different second type of conductivity. In FIG. 4D, the following is assumed: the first type of conductivity is a positive-type (P-type) conductivity appropriate to PMOS transistors; and the second type of conductivity is a negative-type (N-type) of conductivity appropriate to NMOS transistors. In some embodiments, alternatively, the first type of conductivity is a negative-type (N-type) of conductivity and the second type of conductivity is a positive-type (P-type) conductivity.

In FIG. 4D, in a GMD layer 575(4) (FIGS. 5A-5B), portion 454 of the memory device further includes gate structures 460(1)-460(4) and metal-to-drain/source (MD) structures 462(1)-462(6) that extend in a second direction perpendicular to the first direction, e.g., the second direction is parallel to the Y-axis. In some embodiments, the first and second directions are Cartesian axes other than being correspondingly parallel to the X-axis and the Y-axis. Gate structures 460(2) and 460(3) are substantially collinear. MD structures 462(1) and 462(2) are substantially collinear. MD structures 462(3) and 462(4) are substantially collinear. MD structures 462(5) and 462(6) are substantially collinear. Relative to the X-axis, the locations of gate structures 460(x) alternate with respect to MD structures 462(x). For example, relative to the X-axis, gate structure 460(1) is between (A) substantially collinear MD structures 462(1) & 462(2) and (B) substantially collinear MD structures 462(3) & 462(4). For example, substantially collinear MD structures 462(3) & 462(4) are between (A) gate structure 460(1) and (B) substantially collinear gate structures 460(2) & 460(3).

In FIG. 4D, in a VGD layer 575(5) (FIGS. 5A-5B) over GMD layer 575(4), portion 454 of the memory device further includes via-to-gate (VG) structures 464 and via-to-MD (VD) structures 466 over corresponding ones of gate structures 460(1)-460(4) and MD structures 462(1)-462(6).

Portion 454 of the memory device is arranged according to a grid which includes reference lines that are referred to as alpha tracks α1, α2, α3, α4, α5 and α6 and that extend in a direction parallel to the X-axis. Relative to the Y-axis, VG structures 464 and VD structures 466 are aligned correspondingly to alpha tracks α2-α6. For example, an instance of VG structure 464 under M0 segment 468(9) is aligned to alpha track α4, an instance of VD structure 466 under M0 segment 468(12) is aligned to alpha track α5, or the like. In portion 454 of the memory device, no instance of VG structure 464 nor an instance of VD structure 466 is over alpha track α1.

In FIG. 4D, in a first layer of metallization (M*1st layer) 575(4) (FIGS. 5A-5B) over VGD layer 575(5), portion 454 of the memory device further includes M*1st segments 468(1)-468(13) that extend parallel to the X-axis, are aligned correspondingly to alpha tracks α1-α6, and thus are over corresponding ones of VG structure 464 and VD structure 466. Relative to the Y-axis: a distance between adjacent alpha tracks is one instance of a unit of measure referred to as a track pitch (TP).

In FIG. 4D, a numbering convention is assumed in which the M*1st layer is metallization layer zero (M0) and correspondingly a first layer of interconnection (VIA*1st layer) is interconnection layer zero (V0). Accordingly, M*1st segments 468(1)-468(13) are M0 468(1)-468(13). In some embodiments, depending upon the numbering convention of the corresponding process node by which portion 454 of the memory device corresponding to FIGS. 4C and 5A-5B, the M*1st layer is metallization layer one (M1) and correspondingly the VIA*1st layer is interconnection layer one (V1).

Relative to the X-axis, gate structures 460(1)-460(4) are separated from each other by a uniform distance. In FIG. 4D, the uniform distance represents one contacted poly pitch (CPP) for the corresponding semiconductor process technology node. Here, the word 'poly' in the term CPP does not necessarily imply that the gate structures in semiconductor devices based correspondingly on FIG. 4D are to be formed of polysilicon but instead represents a historical convenience, i.e., because gate structures in ICs manufactured according to a predecessor semiconductor process technology node often were typically formed of polysilicon.

In FIG. 4D, portion 454 further includes a first layer of interconnection (VIA*1st) layer 575(5) (FIGS. 5A-5B), which is referred to herein as V0 layer 575(5) according to the assumed naming convention, and which is over M0 layer 575(4). In V0 layer 575(5), portion 454 further includes instances of via-to-M*1st (VIA*1st) structure, i.e., via-to-M0 (V0) structure, 470 over corresponding ones of M0 segments 468(9), 468(10) and 468(13). Relative to the Y-axis, V0 structures 470 are aligned substantially to long axes of corresponding M0 segments 468(9), 468(10) and 468(13).

Portion 454 further includes a second layer of metallization (M*2nd layer) 575(6) (FIGS. 5A-5B), which is referred to herein as M1 layer 575(6) according to the assumed naming convention, and which is over V0 layer 575(5). In M1 layer 575(6), portion 454 further includes M*2nd segments, i.e., M1 segments, 472(1)-472(2) that extend parallel to the Y-axis and are over corresponding ones of V0 structure 470.

Among other things, NFET N4 (FIGS. 2 and 4A-4C) is represented in portion 454. NFET N4 is coupled between: M0 segment 468(12) which is coupled to emulation signal EMU (FIGS. 2-3); and M0 segment 468(13) which is coupled to voltage VSS (FIG. 2). The gate terminal of NFET N4 is coupled to M1 segment 472(1), the latter being coupled to timing signal TMR (FIGS. 2-3).

Figures 5A, 5B:
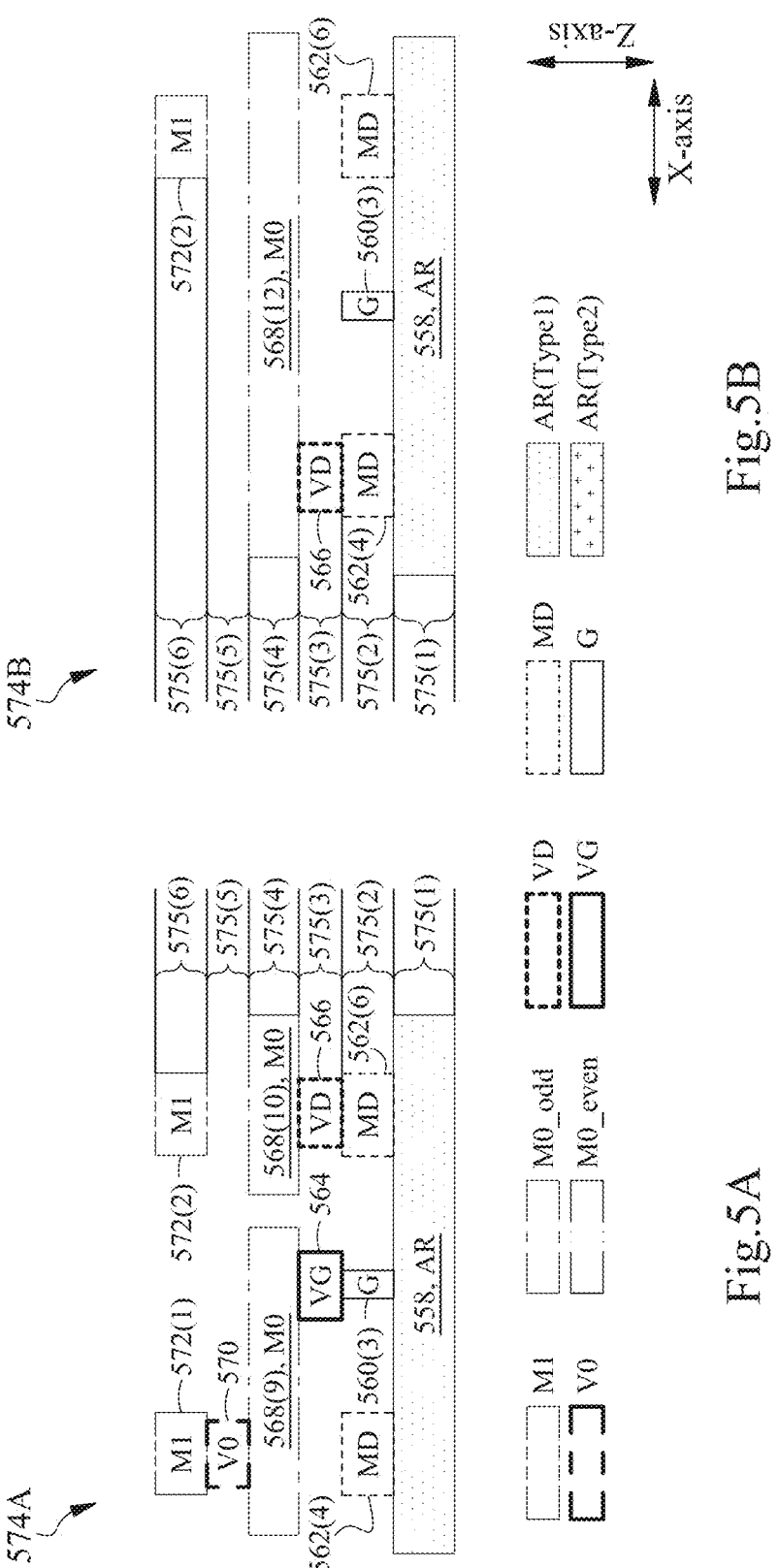
FIGS. 5A-5B are corresponding cross-sections, in accordance with some embodiments.

FIGS. 5A-5B are corresponding cross-sections 574A and 574B of portion 454 of FIG. 4C, in accordance with some embodiments.

Cross-sections 574A-574B follow a similar numbering scheme to that of the layout diagram of portion 454 of FIG. 4C. Though some components correspond, such components also differ. To help identify components which correspond but nevertheless have differences, the numbering convention uses 5-series numbers for cross-sections 574A-574B while FIG. 4C uses 4-series numbers. For example, MD structure 562(4) in FIGS. 5A-5B corresponds to MD structure 462(4) in FIG. 4C., with the similarity being noted by _62(4) and with the differences being reflected in the corresponding leading digit (5 or 4). For brevity, the discussion will focus more on differences between FIGS. 5A-5B and FIG. 4C than on similarities.

Regarding FIG. 5A, cross-section 574A corresponds to section line 5A-5A' in FIG. 4C. Regarding FIG. 5B, cross-section 574B corresponds to section line 5B-5B' in FIG. 4C. Each of FIGS. 5A-5B includes layers 575(1)575(6).

In each of FIGS. 5A-5B, AR layer 575(1) includes AR 558. In each of FIGS. 5A-5B, GMD layer 575(3) includes gate structure 560(3) and MD structures 562(4) and 562(6). In FIG. 5A, VGD layer 575(3) includes an instance of VG structure 564 and an instance of VD structure 566. In FIG. 5B, VGD layer 575(3) include an instance of VD structure 566. In FIG. 5A, M0 layer 575(4) includes M0 segments 568(9) and 568(10). In FIG. 5B, M0 layer 574(4) includes M0 segment 568(12). In FIG. 5A, V0 layer 575(5) includes an instance of V0 structure 570. In FIG. 5A, M1 layer 575(6) includes M1 segments 572(1) and 572(2). In FIG. 5B, M1 layer 575(6) includes M1 segment 572(2).

Figure 6A:
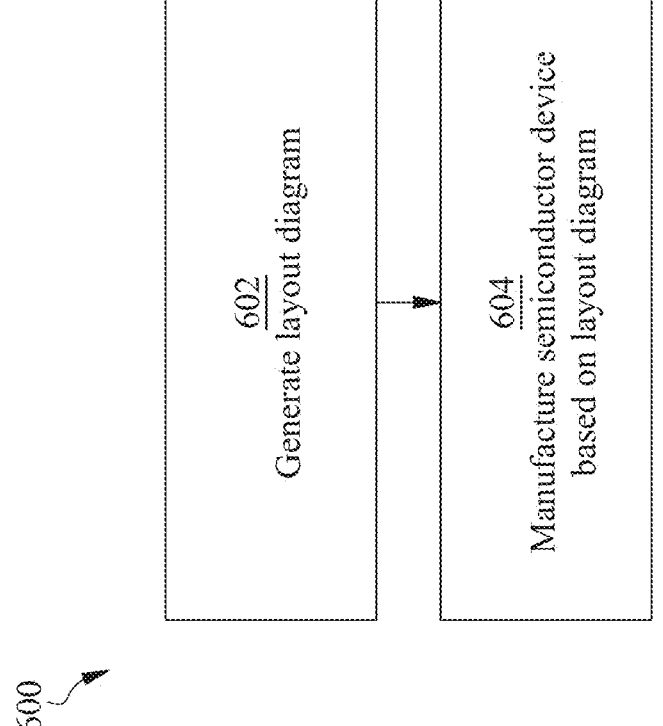
FIGS. 6A-6B are flowcharts of corresponding methods of manufacturing a memory device, in accordance with some embodiments.

FIG. 6A is a flowchart 600 of a method of manufacturing a memory device, in accordance with some embodiments.

The method of flowchart (flow diagram) 600 is implementable, for example, using EDA system 800 (FIG. 8, discussed below) and an IC manufacturing system 900 (FIG. 9, discussed below), in accordance with some embodiments. Examples of a semiconductor device which can be manufactured according to the method of flowchart 600 include the semiconductor devices of FIGS. 1-2 semiconductor devices based on the floorplan diagrams of FIGS. 4A-4C, semiconductor devices based on the layout diagrams disclosed herein, semiconductor devices based on the cross-sections disclosed herein, or the like.

In FIG. 6A, the method of flowchart 600 includes blocks 602-604. At block 602, a layout diagram is generated which, among other things, includes one or more of layout diagrams disclosed herein, or the like. Block 602 is implementable, for example, using EDA system 800 (FIG. 8, discussed below), in accordance with some embodiments. From block 602, flow proceeds to block 604.

At block 604, based on the layout diagram, at least one of (A) one or more photolithographic exposures are made or (B) one or more semiconductor masks are fabricated or (C) one or more components in a layer of a semiconductor device are fabricated. See discussion below of IC manufacturing system 900 in FIG. 9 below.

Figure 6B:

FIG. 6B is a flowchart 605 of a method of fabricating a semiconductor device, and more specifically a memory device, in accordance with some embodiments.

Flowchart 605 is an example of block 604 of FIG. 6A. Flowchart 605 includes blocks 606-622. The method of flowchart 605 is implementable, for example, using IC manufacturing system 900 (FIG. 9, discussed below), in accordance with some embodiments. Examples of a semiconductor device which can be manufactured according to the method of flowchart 600 include the semiconductor devices of FIGS. 1-2 semiconductor devices based on the floorplan diagrams of FIGS. 4A-4C, semiconductor devices based on the layout diagrams disclosed herein, semiconductor devices based on the cross-sections disclosed herein, or the like.

In FIG. 6B, at block 606, active regions (ARs) are formed in a substrate including doping corresponding areas of the substrate. Examples of the active regions including ARs 456 and 458 of FIG. 4D, AR 558 of FIGS. 5A-5B, or the like. From block 606, flow proceeds to block 608.

At block 608, source/drain (S/D) regions representing first transistor components (TCs) are formed in the ARs including doping corresponding first areas of the active regions, wherein second areas of the ARs which are between corresponding S/D regions are channel regions representing second TCs. Examples of S/D regions include portions of AR 558 correspondingly underneath of MD structures 562(4) 562(6) of FIGS. 5A-5B, or the like. Examples of channel regions include portions of AR 558 between the noted example S/D regions, or the like. From block 608, flow proceeds to block 610.

At block 610, gate structures representing third TCs are formed in a gate-and-MD (GMD) layer over corresponding ones of the active regions, and more particularly over corresponding ones of the channel regions. An example of the GMD layer is GMD layer 575(2) of FIGS. 5A-5B. Examples of the gate structures includes gate structures 460(1)-460(4) of FIG. 4D, 560(3) of FIGS. 5A-5B, or the like. From block 610, flow proceeds to block 612.

At block 612, metal-to-S/D (MD) contact structures representing fourth TCs are formed in the GMD layer over corresponding S/D regions. Examples of the MD structures include MD structures 462(1)-462(6) of FIG. 4D, 562(4) and 562(6) of FIGS. 5A-5B, or the like. From block 612, flow proceeds to block 614.

At block 614, via-to-gate/MD (VGD) structures are formed in a VMD layer over corresponding ones of the gate structures and the MD contact structures. VGD structures include two types, namely via-to-gate (VG) structures and via-to-MD (VD) structures. Examples of the VG structure type of VGD structure include the instances of VG structure 464 in FIG. 4D, 564 in FIG. 5A, or the like. Examples of the VD structure type of VGD structure include the instances of VD structure 466 in FIG. 4D, 566 in FIGS. 5A-5B, or the like. From block 614, flow proceeds to block 616.

Relative to an orthographic projection of the memory device (formed by the method of flowchart 605) onto a reference plane, the memory device is arranged into nonoverlapping areas which include: a bit cells area (e.g., 432 of FIGS. 4A-4C); a main input/output (I/O) area (e.g., 434A/B/C of corresponding FIGS. 4A-4C); a main controller area (e.g., 436A/B/C of corresponding FIGS. 4A-4C)); and a word line driver area (e.g., 438A/B/C of corresponding FIGS. 4A-4C)).

Regarding FIG. 6B, in some embodiments, the forming active regions of block 606, the forming S/D regions and corresponding channel regions of block 608, the forming gate structures of block 610, the forming MD contact structures of block 612 and the forming VGD structures of block 614 result in the VGD structures electrically coupling corresponding sets of the first to fourth transistor-components as follows including: a first set as a first array (e.g., 116) of memory cells (e.g., 206) in the bit cells area (e.g., 432 of FIGS. 4A-4C); a second set as a second array (e.g.,

102) of tracking cells (e.g., 202) in the bit cells area (e.g., 432 of FIGS. 4A-4C); and being configured to emulate the first array (e.g., 116); a third set as a first adjust circuit (e.g., 108(1)) in the word line driver area (e.g., 438x); a fourth set as a second adjust circuit (e.g., 108(2)) in one of the nonoverlapping areas other than the bit cells area (e.g., 432); and a fifth set as an adjust-timing circuit (e.g., 106) in the main controller area (e.g., 436x) and being coupled to each of the first (e.g., 108(1)) and second (e.g., 108(2)) adjust circuit.

At block 616, metallization segments in corresponding metallization layers and interconnection structures in corresponding interconnection layers are formed on an interleaved layer basis. Examples of the metallization layers are discussed below. An example of the interconnection layers is discussed below. Within block 616, flow proceeds to block 618.

At block 618, M*1st metallization segments in a first metallization layer are formed over corresponding instances of the VGD structures. An example of the first metallization layer is M0 layer 575(4) of FIGS. 5A-5B, or the like. Examples of the M*1st metallization segments include M0 segments 468(1)-468(13) of FIG. 4C, 568(9) and 568(10) of FIG. 5A, 568(12) of FIG. 5B, or the like. From block 618, flow proceeds to block 620.

At block 620, V*1st interconnection structures are formed in a first interconnection layer and over corresponding ones of the M*1st metallization segments. An example of the first interconnection layer is V0 layer 575(5) of FIGS. 5A-5B, or the like. Examples of the V*1st interconnection structures include instances of V0 structure 470 in FIG. 4C, 570 in FIG. 5B, or the like. From block 620, flow proceeds to block 622.

At block 622, M*2nd metallization segments are formed in a second metallization layer over corresponding instances of the VGD structures. An example of the second metallization layer is M1 layer 575(6) of FIGS. 5A-5B, or the like. Examples of M*2nd metallization segments include M1 segments 472(1)-472(2) of FIG. 4C, 572(1) and 572(2) of FIGS. 5A-5B, or the like.

In some embodiments, the forming metallization segments and interconnection structures of block 616 produces the following including: a first word line (e.g., word line WL) in the bit cells area (e.g., 432 of FIGS. 4A-4C) and coupled to ones of the memory cells (e.g., 206) in a corresponding one of rows of the first array (e.g., 116) and the tracking cells (e.g., 202); a bit line (e.g., bit line BL) coupled to ones of the memory cells (e.g., 206) in a corresponding one of columns of the first array (e.g., 116); and a second word line (e.g., tracking word line TWL) in the main I/O area (e.g., 434A/B/C of corresponding FIGS. 4A-4C) configured to emulate the first word line (e.g., word line WL). In some embodiments, the fourth set, representing the second adjust circuit (108(2)), is in the main controller region (436A). In some embodiments, the fourth set, representing the second adjust circuit (108(2)), is in the main I/O region (434B). In some embodiments, the fourth set, representing the second adjust circuit (108(2)), is in the word line driver region (438C).

In some embodiments, the forming metallization segments and interconnection structures electrically couples the following including: the first adjust circuit (e.g., 108(1)) between the second word line (e.g., TWL) and the bit line (e.g., BL); the second adjust circuit (e.g., 108(2)) to the second word line (e.g., TWL); and the adjust-timing circuit (e.g., 106) to each of the second adjust circuits (e.g., 108(2)).

FIG. 7 is a flowchart 700 of a method of operating a memory device, in accordance with some embodiments.

Examples of memory devices operated according to flowchart 700 include the memory devices of FIGS. 1, 2, 4A-4C, or the like.

Flowchart 700 includes blocks 702-718. At block 702, an active edge of an initiation signal is received at word line driver and at adjust timer. Examples of the initiation signal include the READ clock signal or the WRITE clock signal which are mentioned in the discussion of FIG. 3, or the like. From block 702, flow proceeds to block 704.

At block 704, a first voltage on a first word line is raised towards a first reference voltage. An example of the first word line is word line WL of FIGS. 1-2, or the like. An example of the first voltage is voltage v_DW of signal DW on word line WL which is mentioned in the discussion of FIG. 3, or the like. An example of the first reference voltage is VDD which is mentioned in the discussion of FIG. 3, or the like. From block 704, flow proceeds to block 706.

At block 706, a second voltage on a second word line is raised towards the first reference voltage. An example of the second word line is tracking word line TWL of FIGS. 1-2, or the like. An example of the second voltage is voltage v_EMU of signal EMU on word line TWL which is mentioned in the discussion of FIG. 3, or the like. From block 706, flow proceeds to block 708.

At block 708, the first voltage is hindered from substantially reaching the first reference voltage. Bock 708 includes block 710. An example of the first voltage is voltage v_DW of signal DW on word line WL of FIGS. 1-2, 4A-4C, or the like. At block 710, an example of hindering the first voltage from reaching the first reference voltage is turning on a first adjust circuit. An example of the first adjust circuit is adjust circuit 108(1) of FIGS. 1-2, 4A-4C, or the like, which includes a pull-down transistor NFET N3. When turned on, NFET N3 pulls voltage v_DW of signal DW on word line WL towards reference voltage VSS which is a more detailed example of hindering the first voltage from substantially reach the first reference voltage. From block 710, flow exits block 708 and proceeds to block 712.

At block 712, the second voltage is hindered from substantially reaching the first reference voltage. An example of the second voltage is voltage v_EMU of signal EMU on word line TWL of FIGS. 1-2, 4A-4C, or the like. Bock 712 includes block 714. At block 714, a second adjust circuit is turned on. An example of hindering the second voltage from reaching the second reference voltage is turning on a second adjust circuit. An example of the second adjust circuit is adjust circuit 108(2) of FIGS. 1-2, 4A-4C, or the like, which includes a pull-down transistor NFET N4. When turned on, NFET N4 pulls voltage v_EMU of signal EMU on tracking word line TWL towards reference voltage VSS which is more detailed example of hindering the second voltage from substantially reach the first reference voltage. From block 714, flow exits block 712 and proceeds to block 716.

At block 716, a condition is detected, the condition being a third voltage on a first bit line has reached a predetermined value. An example of the third voltage is voltage v_TLBT of signal TBLT on tracking bit line TBL of FIG. 2, or the like. An example of detecting that the third voltage on the first bit line has reached predetermined value is the operation of BLT tracking circuit 104 of FIGS. 1-2, or the like. From block 716, flow proceeds to block 718.

At block 718, each of the first and second adjust circuits is turned off. Recalling that examples of the first and second adjust circuits include corresponding adjust circuits 108(1) and 108(2) of FIGS. 1-2 and 4A-4C, or the like, examples of each of the first and second adjust circuits includes the discussion of FIG. 3 regarding second time instance t2 and fourth time instance t4, or the like.

In some embodiments, blocks 702-718 are performed as part of a READ operation. An example of a READ operation is, e.g., is discussed in the context of FIG. 3 regarding first time instance t1 and second time instance t2, or the like. In some embodiments, blocks 702-718 are performed as part of a WRITE operation. An example of a WRITE operation is, e.g., is discussed in the context of FIG. 3 regarding third time instance t3, fourth time instance t4 and fifth time instance t5, or the like.

In some embodiments in which blocks 702-718 are performed as part of a WRITE operation, the method further includes: after the receiving an active edge of a write-operation-initiation signal, applying a write-adjust voltage VWA (e.g., voltage VWA of FIGS. 2-3) as a positive supply voltage CVDD for the first array (e.g., 116) such that CVDD=VWA. In such embodiments, the write-adjust voltage VWA is less than a reference supply voltage VDD for a larger system that includes the first array (e.g., 116); where VWA<VDD; and where CVDD<VDD. In such embodiments in which blocks 702-718 are performed as part of a WRITE operation, the method further includes, a predetermined time after the applying a write-adjust voltage VWA, applying the reference supply voltage VDD as the positive supply voltage CVDD such that CVDD=VDD.

In such embodiments in which blocks 702-718 are performed as part of a WRITE operation, the method further includes, after the receiving an active edge of a write-operation-initiation signal, controlling a multiplexer (e.g., 114 FIGS. 1-2, 4A-4C) to select the write-adjust voltage VWA as the positive supply voltage CVDD rather than the reference supply voltage VDD.

Figure 8:
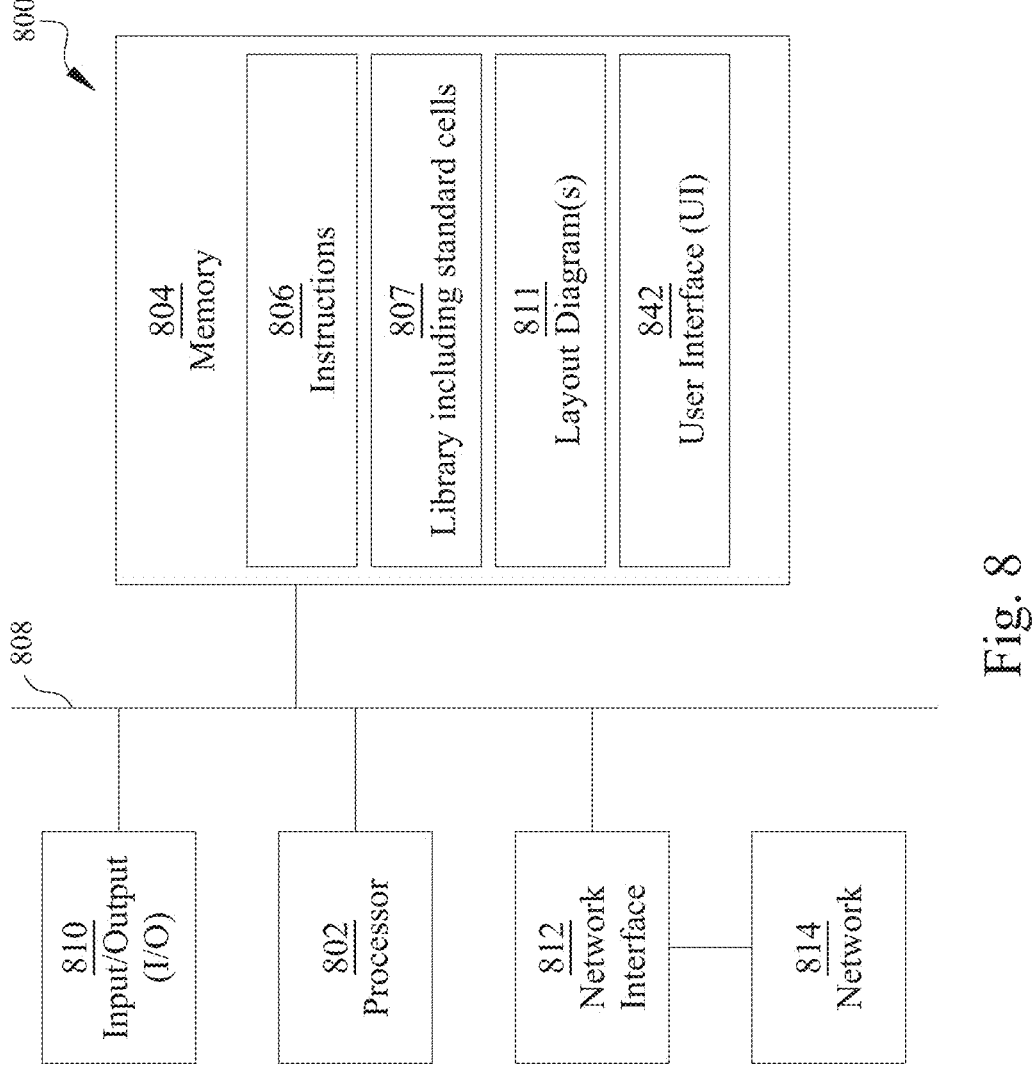
FIG. 8 is a block diagram of an electronic design automation (EDA) system in accordance with some embodiments.

FIG. 8 is a block diagram of an electronic design automation (EDA) system 800 in accordance with some embodiments.

In some embodiments, EDA system 800 includes an automatic placement and routing (APR) system. In some embodiments, EDA system 800 is a general purpose computing device including a hardware processor 802 and a non-transitory, computer-readable storage medium 804. Storage medium 804, amongst other things, is encoded with, i.e., stores, computer program code 806, i.e., a set of executable instructions. Execution of instructions 806 by hardware processor 802 represents (at least in part) an EDA tool which implements a portion or all of, e.g., the method of FIG. 6A (block 602), methods of generating layout diagrams such as FIG. 4D, methods of generating layout diagrams corresponding to block diagrams such as FIGS. 1-2, or the like, in accordance with one or more embodiments (hereinafter, the noted processes and/or methods). Storage medium 804, amongst other things, stores layout diagrams 811 such as the layout diagrams disclosed herein, other the like.

Processor 802 is electrically coupled to computer-readable storage medium 804 via a bus 808. Processor 802 is further electrically coupled to an I/O interface 810 by a bus 808. A network interface 812 is further electrically connected to processor 802 via bus 808. Network interface 812 is connected to a network 814, so that processor 802 and computer-readable storage medium 804 are capable of connecting to external elements via network 814. Processor 802 is configured to execute computer program code 806 encoded in computer-readable storage medium 804 in order to cause system 800 to be usable for performing a portion or all of the noted processes and/or methods. In one or more embodiments, processor 802 is a central processing unit (CPU), a multi-processor, a distributed processing system, an application specific integrated circuit (ASIC), and/or a suitable processing unit.

In one or more embodiments, computer-readable storage medium 804 is an electronic, magnetic, optical, electromagnetic, infrared, and/or a semiconductor system (or apparatus or device). For example, computer-readable storage medium 804 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 804 includes a compact disk-read only memory (CD-ROM), a compact disk-read/write (CD-R/W), and/or a digital video disc (DVD).

In one or more embodiments, storage medium 804 stores computer program code 806 configured to cause system 800 (where such execution represents (at least in part) the EDA tool) to be usable for performing a portion or all of the noted processes and/or methods. In one or more embodiments, storage medium 804 further stores information which facilitates performing a portion or all of the noted processes and/or methods. In one or more embodiments, storage medium 804 stores library 807 of standard cells including such standard cells as disclosed herein. In some embodiments, storage medium 804 stores one or more layout diagrams 811.

EDA system 800 includes I/O interface 810. I/O interface 810 is coupled to external circuitry. In one or more embodiments, I/O interface 810 includes a keyboard, keypad, mouse, trackball, trackpad, touchscreen, and/or cursor direction keys for communicating information and commands to processor 802.

EDA system 800 further includes network interface 812 coupled to processor 802. Network interface 812 allows system 800 to communicate with network 814, to which one or more other computer systems are connected. Network interface 812 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 800.

System 800 is configured to receive information through I/O interface 810. The information received through I/O interface 810 includes one or more of instructions, data, design rules, libraries of standard cells, and/or other parameters for processing by processor 802. The information is transferred to processor 802 via bus 808. EDA system 800 is configured to receive information related to a user interface (UI) through I/O interface 810. The information is stored in computer-readable medium 804 as UI 842.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 800. In some embodiments, a layout which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 9:
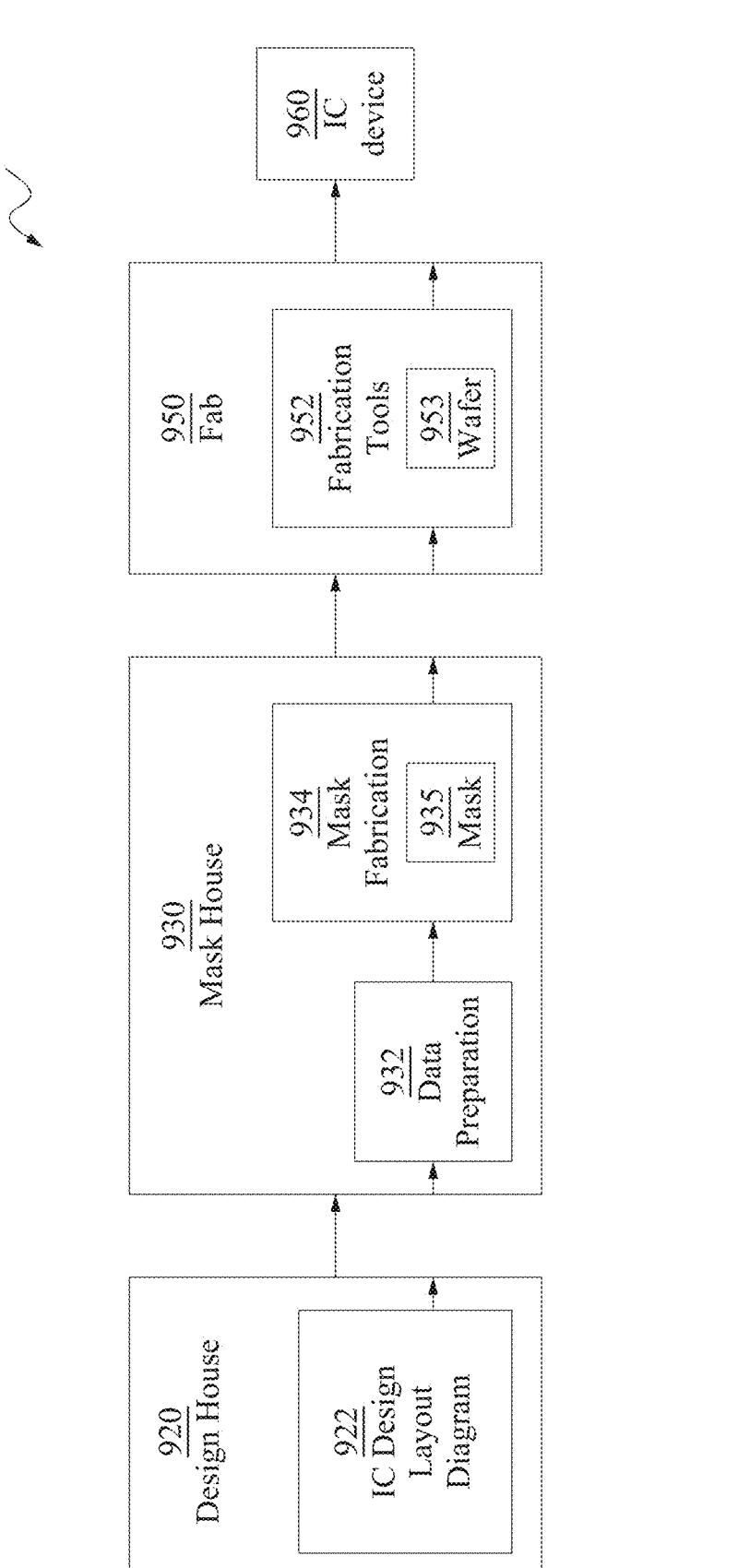
FIG. 9 is a block diagram of an integrated circuit (IC) manufacturing system, and an IC manufacturing flow associated therewith, in accordance with some embodiments.

FIG. 9 is a block diagram of an integrated circuit (IC) manufacturing system 900, and an IC manufacturing flow associated therewith, in accordance with some embodiments.

Based on the layout diagram generated by block 602 of FIG. 6A, the IC manufacturing system 900 implements block 604 of FIG. 6A wherein at least one of (A) one or more semiconductor masks or (B) at least one component in a layer of an inchoate semiconductor integrated circuit is fabricated using manufacturing system 900.

In FIG. 9, IC manufacturing system 900 includes entities, such as a design house 920, a mask house 930, and an IC manufacturer/fabricator ("fab") 950, that interact with one another in the design, development, and manufacturing cycles and/or services related to manufacturing an IC device 960. The entities in system 900 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and supplies services to and/or receives services from one or more of the other entities. In some embodiments, two or more of design house 920, mask house 930, and IC fab 950 is owned by a single larger company. In some embodiments, two or more of design house 920, mask house 930, and IC fab 950 coexist in a common facility and use common resources.

Design house (or design team) 920 generates an IC design layout 922. IC design layout 922 includes various geometrical patterns designed for an IC device 960. The geometrical patterns correspond to patterns of metal, oxide, or semiconductor layers that make up the various components of IC device 960 to be fabricated. The various layers combine to form various IC features. For example, a portion of IC design layout 922 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Source/drain region (s) may refer to a source or a drain, individually or collectively, dependent upon the context. Design house 920 implements a proper design procedure to form IC design layout 922. The design procedure includes one or more of logic design, physical design or place and route. IC design layout 922 is presented in one or more data files having information of the geometrical patterns. For example, IC design layout 922 is expressed in a GDSII file format or DFII file format.

Mask house 930 includes data preparation 932 and mask fabrication 934. Mask house 930 uses IC design layout 922 to manufacture one or more masks 935 to be used for fabricating the various layers of IC device 960 according to IC design layout 922. Mask house 930 performs mask data preparation 932, where IC design layout 922 is translated into a representative data file ("RDF"). Mask data preparation 932 supplies the RDF to mask fabrication 934. Mask fabrication 934 includes a mask writer. A mask writer converts the RDF to an image on a substrate, such as a mask (reticle) or a semiconductor wafer. The design layout is manipulated by mask data preparation 932 to comply with particular characteristics of the mask writer and/or requirements of IC fab 950. In FIG. 9, mask data preparation 932, mask fabrication 934, and mask 935 are illustrated as separate elements. In some embodiments, mask data preparation 932 and mask fabrication 934 are collectively referred to as mask data preparation.

In some embodiments, mask data preparation 932 includes optical proximity correction (OPC) which uses lithography enhancement techniques to compensate for image errors, such as those that can arise from diffraction, interference, other process effects and the like. OPC adjusts IC design layout 922. In some embodiments, mask data preparation 932 includes further resolution enhancement techniques (RET), such as off-axis illumination, sub-resolution adjust features, phase-shifting masks, other suitable techniques, and the like or combinations thereof. In some embodiments, inverse lithography technology (ILT) is further used, which treats OPC as an inverse imaging problem.

In some embodiments, mask data preparation 932 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 934, which may undo part of the modifications performed by OPC in order to meet mask creation rules.

In some embodiments, mask data preparation 932 includes lithography process checking (LPC) that simulates processing that will be implemented by IC fab 950 to fabricate IC device 960. LPC simulates this processing based on IC design layout 922 to fabricate a simulated manufactured device, such as IC device 960. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been fabricated by LPC, if the simulated device is not close enough in shape to satisfy design rules, OPC and/or MRC are be repeated to further refine IC design layout 922.

The above description of mask data preparation 932 has been simplified for the purposes of clarity. In some embodiments, mask data preparation 932 includes additional features such as a logic operation (LOP) to modify the IC design layout according to manufacturing rules. Additionally, the processes applied to IC design layout 922 during data preparation 932 may be executed in a variety of different orders.

After mask data preparation 932 and during mask fabrication 934, a mask 935 or a group of masks 935 are fabricated based on the modified IC design layout. In some embodiments, an electron-beam (e-beam) or a mechanism of multiple e-beams is used to form a pattern on a mask (photomask or reticle) based on the modified IC design layout. The masks are formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask is an attenuated PSM or alternating PSM. The mask(s) generated by mask fabrication 934 is used in a variety of processes. For example, such a mask(s) is used in an ion implantation process to form various doped regions in the semiconductor wafer, in an etching process to form various etching regions in the semiconductor wafer, and/or in other suitable processes.

IC fab 950 is an IC fabrication business that includes one or more manufacturing facilities for the fabrication of a variety of different IC products. In some embodiments, IC fab 950 is a semiconductor foundry. For example, there may be a manufacturing facility for the front end fabrication of a plurality of IC products (front-end-of-line (FEOL) fabrication), while a second manufacturing facility may supply the back end fabrication for the interconnection and packaging of the IC products (back-end-of-line (BEOL) fabrication), and a third manufacturing facility may supply other services for the foundry business.

IC fab 950 uses mask (or masks) 935 fabricated by mask house 930 to fabricate IC device 960 using fabrication tools 952. Thus, IC fab 950 at least indirectly uses IC design layout 922 to fabricate IC device 960. In some embodiments, a semiconductor wafer 953 is fabricated by IC fab 950 using mask (or masks) 935 to form IC device 960. Semiconductor wafer 953 includes a silicon substrate or other proper substrate having material layers formed thereon. Semiconductor wafer further includes one or more of various doped regions, dielectric features, multilevel interconnects, and the like (formed at subsequent manufacturing steps).

In some embodiments, a memory device includes: a first array of memory cells; a second array of tracking cells, the second array being configured to emulate the first array; a first word line coupled to corresponding ones of the memory cells in a corresponding one of rows of the first array and to the tracking cells; a second word line configured to emulate the first word line; a first adjust circuit coupled to the first word line; a second adjust circuit coupled to the second word line; and an adjust-timing circuit coupled to the second adjust circuit.

In some embodiments, the second adjust circuit is configured to selectively reduce a voltage level of the second word line based a signal from the adjust-timing circuit.

In some embodiments, the second adjust circuit includes a metal-oxide field-effect transistor (MOSFET) having a negative channel (NFET) coupled between the second word line and a low reference voltage-node of the memory device.

In some embodiments, relative to an orthographic projection of the memory device onto a reference plane, the memory device is arranged into different areas including an array area, a main input/output (IO) area, a main controller area and a word-line driver area; each of the first array of memory cells, a majority of the first word line and the second array is in the array area; a majority of the second word line is in a main IO area; and the first adjust circuit is in the word-line driver area.

In some embodiments, the second adjust circuit is in the main controller area.

In some embodiments, the second adjust circuit is in the main IO area.

In some embodiments, the second adjust circuit is in the word-line driver area.

In some embodiments, the first adjust circuit is configured to selectively reduce a voltage level of the first word line based on a signal from the adjust-timing circuit; and the adjust-timing circuit is also coupled to the first adjust circuit.

In some embodiments, the second adjust circuit is further configured to exhibit substantially a same operational profile as an operational profile exhibited by the first adjust circuit.

In some embodiments, relative to an orthographic projection of the memory device onto a reference plane, the memory device is arranged into corresponding areas which are nonoverlapping; and the first adjust circuit and the second adjust circuit are in a same one of the areas.

In some embodiments, relative to an orthographic projection of the memory device onto a reference plane, the memory device is arranged into corresponding areas which are nonoverlapping; and the first adjust circuit and the second adjust circuit are free from being in a same one of the areas.

In some embodiments, the first adjust circuit includes a metal-oxide field-effect transistor (MOSFET) having a negative channel (NFET) coupled between the first word line and a low reference voltage-node of the memory device.

In some embodiments, the memory device further includes a third adjust circuit coupled to the first word line.

In some embodiments, the third adjust circuit is configured to adjust a voltage on the tracking bit line based on a voltage on the second word line.

In some embodiments, a method (of operating a memory device) includes: In some embodiments, raising a first voltage on a first word line towards a first reference voltage, the first word line being coupled to a first array of memory cells, and further being coupled to ones of the memory cells in a corresponding one of rows of the first array; and raising a second voltage on a second word line towards the first reference voltage; hindering the first voltage on the first word line from substantially reaching the first reference voltage; and hindering the second voltage on the second word line from substantially reaching the first reference voltage.

In some embodiments, the method is performed as a part of a read operation or a write operation of the memory cells.

In some embodiments, the hindering a second voltage begins at substantially a same time as the hindering a first voltage begins; the method further includes (1) after the first voltage has been hindered but before the raising a first voltage is terminated, ceasing to hinder the first voltage, and (2) after the second voltage has been hindered but before the raising a second voltage is terminated, ceasing to hinder the second voltage; and the ceasing to hinder the second voltage begins at substantially a same time as the ceasing to hinder the first voltage.

In some embodiments, the method further includes receiving an active edge of an initiation signal at a word line driver and at an adjust timer, the initiation signal being a signal to initiate a read operation or a write operation, and wherein: after the receiving an active edge of an initiation signal, the hindering the first voltage includes turning on a first adjust circuit coupled to the first word line; and after the receiving an active edge of an initiation signal, the hindering the second voltage includes turning on a second adjust circuit coupled to the second word line.

In some embodiments, the method further includes detecting that a third voltage on a first bit line reaches a predetermined value, the first bit line being coupled to tracking cells of a second array, and wherein: in response to the third voltage reaching the predetermined value, the hindering the first voltage includes turning off the first adjust circuit; and in response to the third voltage reaching the predetermined value, the hindering the second voltage includes turning off the second adjust circuit.

In some embodiments, the turning on a first adjust circuit includes: using a metal-oxide field-effect transistor (MOSFET) having a negative channel (NFET) coupled between the first word line and a low reference voltage-node of the memory device to hinder the first voltage on the first word line from substantially reaching the first reference voltage.

In some embodiments, the turning on a second adjust circuit includes: using a metal-oxide field-effect transistor (MOSFET) having a negative channel (NFET) coupled between the second word line and a low reference voltage-node of the memory device to hinder the second voltage on the second word line from substantially reaching the first reference voltage.

In some embodiments, the method is performed as a part of a write operation of the memory cells, and the method further includes after receiving an active edge of a write-operation-initiation signal, applying a write-adjust voltage VWA as a positive supply voltage CVDD for the first array such that CVDD=VWA; and the write-adjust voltage VWA is less than a reference supply voltage VDD for a larger system that includes the first array; VWA<VDD; and CVDD<VDD.

In some embodiments, the method further includes, a predetermined time after the applying a write-adjust voltage VWA, applying the reference supply voltage VDD as the positive supply voltage CVDD such that CVDD=VDD.

In some embodiments, the applying a write-adjust voltage (VWA) as a positive supply voltage (CVDD) includes after receiving the active edge of the write-operation-initiation signal, controlling a multiplexer to select the write-adjust voltage VWA as the positive supply voltage CVDD rather than the reference supply voltage VDD.

In some embodiments, the applying a write-adjust voltage (VWA) as a positive supply voltage (CVDD) includes a predetermined time after the controlling a multiplexer to select the write-adjust voltage VWA, controlling the multiplexer to select the reference supply voltage VDD as the positive supply voltage CVDD rather than the write-adjust voltage VWA.

In some embodiments, a method (of forming a memory device) includes: forming active regions in a substrate; forming source/drain (S/D) regions in the active regions as first transistor-components, wherein areas of the active regions between corresponding S/D regions are channel regions representing second transistor-components; forming gate structures over corresponding ones of the channel regions as third transistor-components; forming metal-to-S/D (MD) contact structures over corresponding ones of the S/D regions as fourth transistor-components; forming via-to-gate/MD (VGD) structures over corresponding ones of the gate structures and the MD contact structures as fifth transistor-components; relative to an orthographic projection of the memory device onto a reference plane, the memory device being arranged into nonoverlapping areas including a bit cells area, a main input/output (I/O) area, a main controller area, and a word line driver area; the VGD structures electrically coupling corresponding sets of the first to fourth transistor-components including: a first set as a first array of memory cells in the bit cells area; a second set as a second array of tracking cells in the bit cells area and being configured to emulate the first array; a third set as a first adjust circuit in one of the nonoverlapping areas other than the bit cells area; and a fourth set as an adjust-timing circuit in the main controller area and being coupled to the first adjust circuit; and forming metallization segments in corresponding metallization layers and interconnection structures in corresponding interconnection layers on an interleaved layer basis correspondingly over the first to fourth sets; and wherein: the forming metallization segments and interconnection structures produces: a first word line in the bit cells area and coupled to ones of the memory cells in a corresponding one of rows of the first array and to the tracking cells; and a second word line in the main I/O area configured to emulate the first word line; and the forming metallization segments and interconnection structures electrically couples: the first adjust circuit to the second word line; and the adjust-timing circuit to the first adjust circuit.

In some embodiments, the third set, representing the first adjust circuit, is in the main controller area.

In some embodiments, the third set, representing the first adjust circuit, is in the main I/O area.

In some embodiments, the third set, representing the first adjust circuit, is in the word line driver area.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A memory device comprising:
a first array of memory cells;
a second array of tracking cells, the second array being configured to emulate the first array;
a first word line coupled to corresponding ones of the memory cells in a corresponding one of rows of the first array and to the tracking cells;
a second word line configured to emulate the first word line;
a first adjust circuit coupled to the first word line;
a second adjust circuit coupled to the second word line; and
an adjust-timing circuit coupled to the second adjust circuit.

2. The memory device of claim 1, wherein:
the second adjust circuit is configured to selectively reduce a voltage level of the second word line based on a signal from the adjust-timing circuit.

3. The memory device of claim 1, wherein:
relative to an orthographic projection of the memory device onto a reference plane, the memory device is arranged into different areas including an array area, a main input/output (IO) area, a main controller area and a word-line driver area;
each of the first array of memory cells, a majority of the first word line and the second array is in the array area;

a majority of the second word line is in a main IO area; and
the first adjust circuit is in the word-line driver area.

4. The memory device of claim 3, wherein:
the second adjust circuit is in the main controller area.

5. The memory device of claim 3, wherein:
the second adjust circuit is in the main IO area.

6. The memory device of claim 3, wherein:
the second adjust circuit is in the word-line driver area.

7. The memory device of claim 1, wherein:
the first adjust circuit is configured to selectively reduce a voltage level of the first word line based on a signal from the adjust-timing circuit; and
the adjust-timing circuit is also coupled to the first adjust circuit.

8. The memory device of claim 1, wherein:
the second adjust circuit is further configured to exhibit substantially a same operational profile as an operational profile exhibited by the first adjust circuit.

9. The memory device of claim 1, wherein:
relative to an orthographic projection of the memory device onto a reference plane, the memory device is arranged into corresponding areas which are nonoverlapping; and
the first adjust circuit and the second adjust circuit are in a same one of the areas.

10. The memory device of claim 1, wherein:
relative to an orthographic projection of the memory device onto a reference plane, the memory device is arranged into corresponding areas which are nonoverlapping; and
the first adjust circuit and the second adjust circuit are free from being in a same one of the areas.

11. The memory device of claim 1, further comprising:
a third adjust circuit coupled between the second word line and a tracking bit line, the tracking bit line being coupled to ones of the tracking cells in the second array.

12. The memory device of claim 11, wherein:
the third adjust circuit is configured to adjust a voltage on the tracking bit line based on a voltage on the second word line.

13. A method of operating a memory device, the method comprising:
raising a first voltage on a first word line towards a first reference voltage, the first word line being coupled to a first array of memory cells, and further being coupled to ones of the memory cells in a corresponding one of rows of the first array; and
raising a second voltage on a second word line towards the first reference voltage, the second word line being coupled to a second array of tracking cells, the second array being configured to emulate the first array;
hindering the first voltage on the first word line from substantially reaching the first reference voltage; and
hindering the second voltage on the second word line from substantially reaching the first reference voltage.

14. The method of claim 13, wherein:
the hindering the second voltage begins at substantially a same time as the hindering the first voltage begins;
the method further comprises:
after the first voltage has been hindered but before the raising a first voltage is terminated, ceasing to hinder the first voltage; and
after the second voltage has been hindered but before the raising a second voltage is terminated, ceasing to hinder the second voltage; and the ceasing to hinder the second voltage begins at substantially a same time as the ceasing to hinder the first voltage.

15. The method of claim 13, the method further comprising:

receiving an active edge of an initiation signal at a word line driver and at an adjust timer, the initiation signal being a signal to initiate a read operation or a write operation; and wherein:

after the receiving an active edge of an initiation signal, the hindering the first voltage includes:

turning on a first adjust circuit coupled to the first word line; and after the receiving an active edge of an initiation signal, the hindering the second voltage includes:

turning on a second adjust circuit coupled to the second word line.

16. The method of claim 15, further comprising:

detecting that a third voltage on a tracking bit line reaches a predetermined value, the tracking bit line being coupled to the tracking cells of the second array; and wherein:

in response to the third voltage reaching the predetermined value, the hindering the first voltage includes: turning off the first adjust circuit; and in response to the third voltage reaching the predetermined value, the hindering the second voltage includes:

turning off the second adjust circuit.

17. A method of forming a memory device, the method comprising:

forming active regions in a substrate;

forming source/drain (S/D) regions in the active regions as first transistor-components, wherein areas of the active regions between corresponding S/D regions are channel regions representing second transistor-components;

forming gate structures over corresponding ones of the channel regions as third transistor-components;

forming metal-to-S/D (MD) contact structures over corresponding ones of the S/D regions as fourth transistor-components;

forming via-to-gate/MD (VGD) structures over corresponding ones of the gate structures and the MD contact structures as fifth transistor-components;

relative to an orthographic projection of the memory device onto a reference plane, the memory device being arranged into nonoverlapping areas including a bit cells area, a main input/output (I/O) area, a main controller area, and a word line driver area;

the VGD structures electrically coupling corresponding sets of the first to fourth transistor-components including:

a first set as a first array of memory cells in the bit cells area;

a second set as a second array of tracking cells in the bit cells area and being configured to emulate the first array;

a third set as a first adjust circuit in one of the nonoverlapping areas other than the bit cells area; and a fourth set as an adjust-timing circuit in the main controller area and being coupled to the first adjust circuit; and forming metallization segments in corresponding metallization layers and interconnection structures in corresponding interconnection layers on an interleaved layer basis correspondingly over the first to fourth sets; and wherein:

the forming metallization segments and interconnection structures produces:

a first word line in the bit cells area and coupled to ones of the memory cells in a corresponding one of rows of the first array and to the tracking cells; and a second word line in the main I/O area configured to emulate the first word line; and the forming metallization segments and interconnection structures electrically couples:

the first adjust circuit to the second word line; and the adjust-timing circuit to the first adjust circuit.

18. The method of claim 17, wherein:

the third set, representing the first adjust circuit, is in the main controller area.

19. The method of claim 17, wherein:

the third set, representing the first adjust circuit, is in the main I/O area.

20. The method of claim 17, wherein:

the third set, representing the first adjust circuit, is in the word line driver area.

* * * * *